United States Patent
Sato et al.

(10) Patent No.: US 12,237,237 B2
(45) Date of Patent: Feb. 25, 2025

(54) SEMICONDUCTOR MODULE AND MANUFACTURING METHOD THEREFOR

(71) Applicant: FUJI ELECTRIC CO., LTD., Kawasaki (JP)

(72) Inventors: Tadahiko Sato, Matsumoto (JP); Norihiro Nashida, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 234 days.

(21) Appl. No.: 17/752,073

(22) Filed: May 24, 2022

(65) Prior Publication Data

US 2023/0008663 A1 Jan. 12, 2023

(30) Foreign Application Priority Data

Jul. 9, 2021 (JP) .................... 2021-114035

(51) Int. Cl.
*H01L 23/047* (2006.01)
*H01L 21/48* (2006.01)
(Continued)

(52) U.S. Cl.
CPC ........ *H01L 23/047* (2013.01); *H01L 21/4817* (2013.01); *H01L 23/053* (2013.01); *H01L 24/29* (2013.01)

(58) Field of Classification Search
CPC . H01L 23/047; H01L 21/4817; H01L 25/072; H01L 2224/0603; H01L 2224/32225; H01L 2224/40225; H01L 2224/48095; H01L 2224/49112; H01L 2224/73221; H01L 2924/181;
(Continued)

(56) References Cited

U.S. PATENT DOCUMENTS

2012/0300522 A1 11/2012 Tokuyama et al.
2016/0071778 A1* 3/2016 Otsubo .................. H01L 24/29
257/687
(Continued)

FOREIGN PATENT DOCUMENTS

JP 2004214450 A 7/2004
JP 2006210500 A 8/2006
(Continued)

*Primary Examiner* — Patricia D Valenzuela

(57) ABSTRACT

A semiconductor module includes first and second semiconductor chips including first and second main electrodes, respectively; first and second connection terminals electrically connected to the first and second main electrodes, respectively; and an insulating sheet. The first connection terminal includes a first conductor portion including a first peripheral edge and a first terminal portion extending from the first peripheral edge in plan view, and the second connection terminal includes a second conductor portion including a second peripheral edge. A part of the first conductor portion overlap a part of the second conductor portion in plan view. The insulating sheet includes an insulating portion layered between the first and second conductor portions, and a first protruding portion positioned between a tip portion of the first terminal portion and the second peripheral edge in plan view, the first protruding portion forming an angle relative to a surface of the first terminal portion.

14 Claims, 12 Drawing Sheets

(51) Int. Cl.
*H01L 23/00* (2006.01)
*H01L 23/053* (2006.01)

(58) Field of Classification Search
CPC .......... H01L 23/49548; H01L 21/4821; H01L 21/56; H01L 23/3121; H01L 23/49565; H01L 23/053; H01L 24/29
See application file for complete search history.

(56) References Cited

U.S. PATENT DOCUMENTS

2016/0344301 A1* 11/2016 Maruyama .............. H01L 25/18
2016/0351480 A1 12/2016 Fushie et al.

FOREIGN PATENT DOCUMENTS

| | | | |
|---|---|---|---|
| JP | 2011077464 A | 4/2011 | |
| WO | 2015145752 A1 | 10/2015 | |

* cited by examiner

— : CREEPAGE DISTANCE

—: CREEPAGE DISTANCE

SEMICONDUCTOR MODULE AND MANUFACTURING METHOD THEREFOR

CROSS REFERENCE TO RELATED APPLICATION

This application is based on, and claims priority from, Japanese Patent Application No. 2021-114035, filed Jul. 9, 2021, the entire contents of which are incorporated herein by reference.

BACKGROUND

Technical Field

The present disclosure relates to a semiconductor module and to a manufacturing method therefor.

Description of Related Art

A semiconductor module including a plurality of semiconductor chips has been conventionally proposed. For example, WO 2015/145752 discloses a semiconductor module including a plurality of terminals (lead frames) each having a planar shape and connected to a different semiconductor chip, an insulating sheet adhering to the terminals, and a resin sealing element to seal each of the terminals and the insulating sheet.

In the configuration disclosed in WO 2015/145752, the insulating sheet may separate from the resin sealing element. When the insulating sheet separates from the resin sealing element, there is a possibility that electrical insulation between the terminals cannot be maintained in a configuration with insufficient creepage distance between the terminals. A sufficient creepage distance between the terminals enables electrical insulation between the terminals to be maintained. However, leaving sufficient creepage distance between the terminals leads to an increase in the size of the semiconductor module.

SUMMARY

In view of the above circumstances, one aspect of the present invention has an object of enabling provision of electrical insulation between terminals, but avoiding increase semiconductor module size.

In order to solve the above problems, a semiconductor module according to the present disclosure includes: a first semiconductor chip including a first main electrode; a second semiconductor chip including a second main electrode; a first connection terminal electrically connected to the first main electrode; a second connection terminal electrically connected to the second main electrode; and an insulating sheet with insulation properties. The first connection terminal includes a first conductor portion including a first peripheral edge, and a first terminal portion extending from the first peripheral edge in plan view, and the second connection terminal includes a second conductor portion including a second peripheral edge. At least a part of the first conductor portion and at least a part of the second conductor portion overlap one over the other in plan view. The insulating sheet includes an insulating portion layered between the first conductor portion and the second conductor portion, and a first protruding portion positioned between a tip portion of the first terminal portion and the second peripheral edge in plan view, the first protruding portion forming an angle relative to a surface of the first terminal portion.

A manufacturing method for a semiconductor module according to the present disclosure includes: a first process; and a second process. The semiconductor module includes: a first semiconductor chip including a first main electrode; a second semiconductor chip including a second main electrode; a casing portion surrounding the first semiconductor chip and the second semiconductor chip; a first connection terminal electrically connected to the first main electrode; a second connection terminal electrically connected to the second main electrode; an insulating sheet with insulation properties; and a sealing element filled into an inner space of the casing portion. The first connection terminal includes a first conductor portion including a first peripheral edge and a first terminal portion extending from the first peripheral edge in plan view, and the second connection terminal includes a second conductor portion including a second peripheral edge. At least a part of the first conductor portion and at least a part of the second conductor portion overlapping one over the other in plan view, the insulating sheet includes an insulating portion layered between the first conductor portion and the second conductor portion; and a first protruding portion positioned between a tip portion of the first terminal portion and the second peripheral edge in plan view, the first protruding portion forming an angle relative to a surface of the first terminal portion. The first process bends the first protruding portion of the insulating sheet, and the second process fills the sealing element into an inner space of the casing portion after performing the first process.

DESCRIPTION OF EMBODIMENTS

Figure 1:
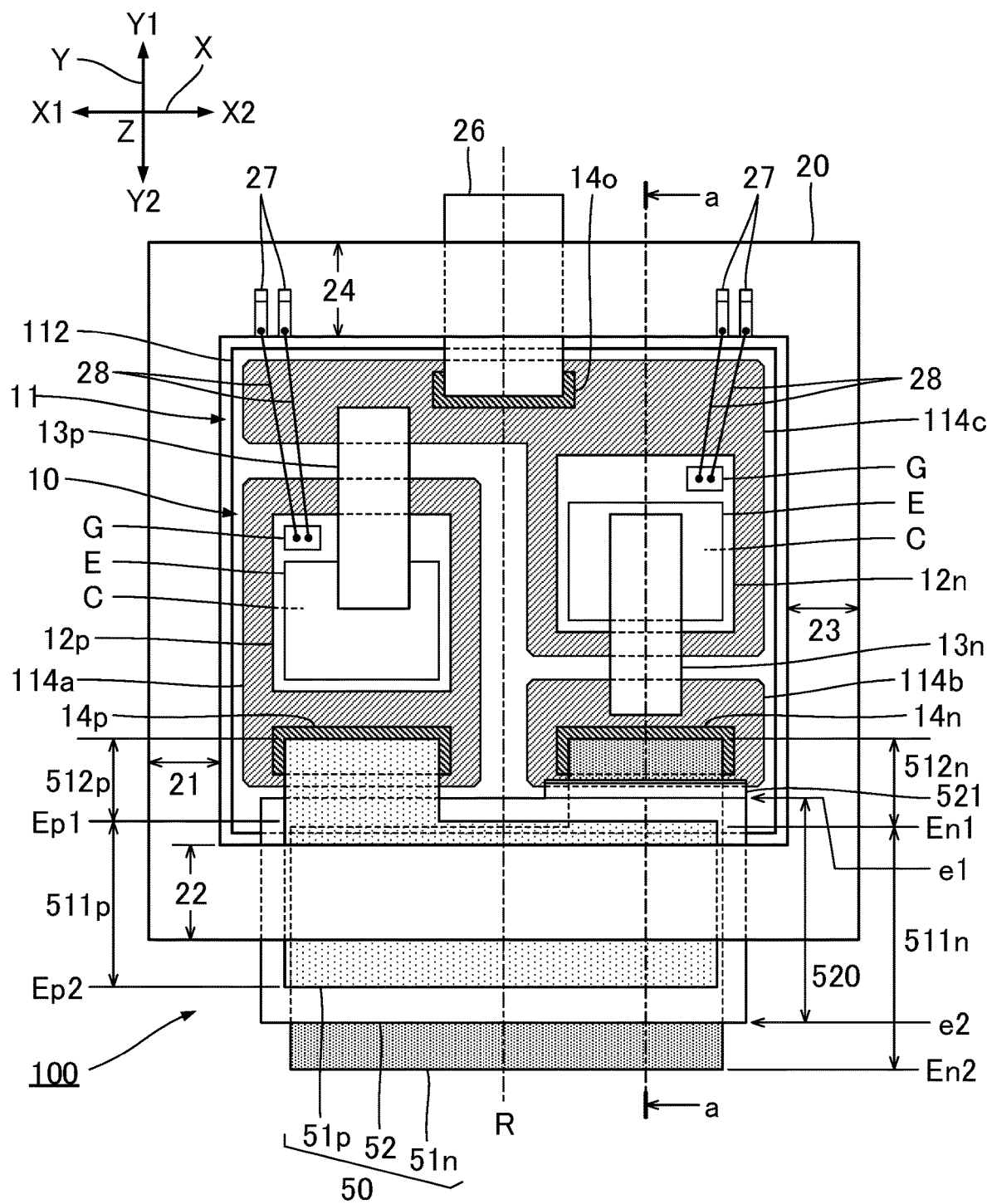
FIG. 1 is a plan view of a configuration of a semiconductor module according to a first embodiment.

Embodiments for implementing the present disclosure are explained with reference to the drawings. It is to be noted that the dimensions and scales of parts in the drawings are different from actual products, as appropriate. The embodiments described below are specific examples that are assumed when the present disclosure is implemented. Therefore, the scope of the present disclosure is not limited to the following embodiments.

A: First Embodiment

A-1: Structure of Semiconductor Module 100

Figure 2:
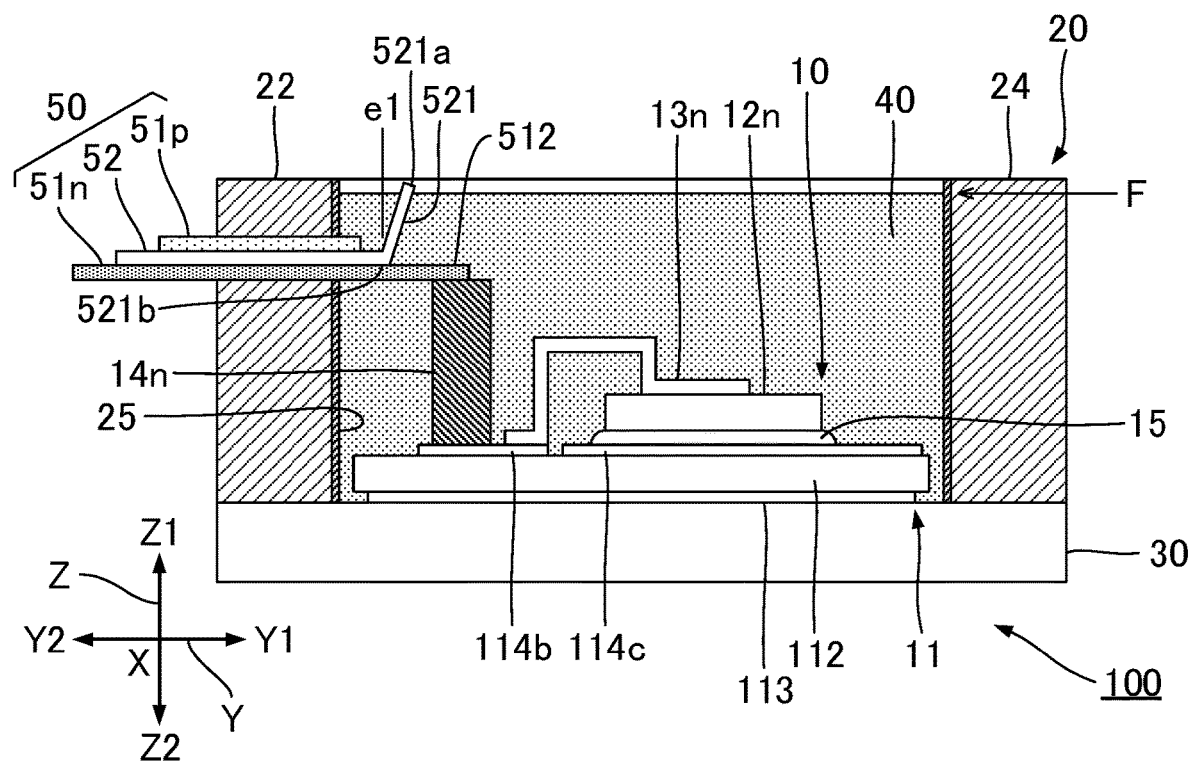
FIG. 2 is a cross-sectional diagram taken along line a-a in FIG. 1.

FIG. 1 is a plan view illustrating an example of the configuration of a semiconductor module 100 according to a first embodiment. FIG. 2 is a cross-sectional diagram taken along line a-a in FIG. 1. As illustrated in FIGS. 1 and 2, in the first embodiment, it is assumed that the X-axis, the Y-axis, and the Z-axis are perpendicular to each other. One direction along the X-axis is denoted as an X1 direction, whereas the direction opposite to the X1 direction is denoted as an X2 direction. One direction along the Y-axis is denoted as a Y1 direction, whereas the direction opposite to the Y1 direction is denoted as a Y2 direction. Similarly, one direction along the Z-axis is denoted as a Z1 direction, whereas the direction opposite to the Z1 direction is denoted as a Z2 direction. Hereinafter, viewing any of the elements of the semiconductor module 100 along the Z-axis direction (in the Z1 direction or the Z2 direction) is represented as a "plan view."

The semiconductor module 100 can be installed in any direction when in practical use. However, in the descriptions below, the Z1 direction is assumed to be an upward direction, and the Z2 direction is assumed to be a downward direction for the sake of convenience. Therefore, a surface of any element of the semiconductor module 100, which faces in the Z1 direction, is sometimes referred to as "topside," and another surface of the element, which faces in the Z2 direction, is sometimes referred to as "underside." As exemplified in FIG. 1, a virtual plane (hereinafter, referred to as "reference plane") R is assumed in the description below, which is parallel to the Y-Z plane. The reference plane R is positioned at the center of the semiconductor module 100 in the X-axis direction. That is, the reference plane R divides the semiconductor module 100 into two equal parts in the X-axis direction.

As exemplified in FIGS. 1 and 2, the semiconductor module 100 according to the first embodiment includes a semiconductor unit 10, a casing portion 20, a base portion 30, a sealing element 40, and a connector 50. In FIG. 1, illustrations of the base portion 30 and the sealing element 40 are omitted for convenience.

The base portion 30 is a structure that supports the semiconductor unit 10 and the casing portion 20. The base portion 30 is made of a conductive material such as aluminum or copper. For example, the base portion 30 is used as a heatsink. The base portion 30 may also be a cooler that cools the semiconductor unit 10, such as a fin or a water-cooling jacket. Furthermore, the base portion 30 may be used as a ground that is set at the ground potential.

The casing portion 20 is a structure in which the semiconductor unit 10 is accommodated. Specifically, the casing portion 20 is formed into a rectangular frame shape surrounding the semiconductor unit 10. As exemplified in FIG. 2, the semiconductor unit 10 is accommodated in the space surrounded by the casing portion 20 and the base portion 30 at the bottom.

The sealing element 40 is filled into the inner space of the casing portion 20 to seal the semiconductor unit 10. The sealing element 40 is made of a resin material such as epoxy resin, silicone gel, or other kinds of resin. For example, a silicon oxide filler, an aluminum oxide filler, or other kinds of filler may be contained in the sealing element 40.

As exemplified in FIGS. 1 and 2, the semiconductor unit 10 includes a layered substrate 11, a semiconductor chip 12p, a semiconductor chip 12n, a wiring portion 13p, a wiring portion 13n, a connection conductor 14p, a connection conductor 14n, and a connection conductor 14o. In the descriptions below, elements associated with the semiconductor chip 12p are denoted by reference numerals added with an ending "p," whereas elements associated with the semiconductor chip 12n are denoted by reference numerals added with an ending "n." When the semiconductor chip 12p and the semiconductor chip 12n do not need to be particularly distinguished from each other (that is, when the description applies to both of them), the semiconductor chip 12p and the semiconductor chip 12n are simply referred to as "semiconductor chips 12." The same applies to the other elements.

The layered substrate 11 is a plate-like member that supports each of the semiconductor chips 12 (12p and 12n), each of wiring portions 13 (13p and 13n), and each of connection conductors 14 (14p, 14n, and 14o). For example, a layered ceramic substrate such as a DCB (Direct Copper Bonding) substrate or an AMB (Active Metal Brazing) substrate, or a metal-based substrate including a resin insulating layer is used as the layered substrate 11.

As exemplified in FIG. 2, the layered substrate 11 is made up of layers of an insulating substrate 112, a metal layer 113, and conductor patterns 114 (114a, 114b, and 114c). The insulating substrate 112 is a rectangular plate-like member made of an insulating material. Although the insulating substrate 112 can be made of any insulating material, a ceramic material such as alumina ($Al_2O_3$), aluminum nitride (AlN), or silicon nitride ($Si_3N_4$), or a resin material such as epoxy resin is used. The reference plane R is also expressed as a plane that divides the insulating substrate 112 into two equal parts in the X-axis direction.

The metal layer 113 is a conductive film formed on the underside of the insulating substrate 112 opposed to the base portion 30. The metal layer 113 is formed over the entire area of the underside of the insulating substrate 112, or a portion of the underside of the insulating substrate 112 (for example, the area excluding the edge portion). The underside of the metal layer 113 is in contact with the topside of the base portion 30. The metal layer 113 is made of a metal material with high thermal conductivity, such as copper or aluminum.

The conductor patterns 114 (114a, 114b, and 114c) are conductive films formed spaced apart from one another on the topside of the insulating substrate 112, which is on the opposite side to the base portion 30. Each of the conductor patterns 114 is made of a low-resistance conductive material, such as copper or copper alloy.

As exemplified in FIG. 1, the conductor pattern 114a is a rectangular conductive film formed on the topside of the insulating substrate 112 in the area in the X1 direction when viewed from the reference plane R. The conductor pattern 114b is a rectangular conductive film formed on the topside of the insulating substrate 112 in the area in the X2 direction when viewed from the reference plane R. The conductor pattern 114c is a conductive film formed in the Y1 direction when viewed from the conductor patterns 114a and 114b. Specifically, the conductor pattern 114c is formed into a planar shape including an area positioned in the Y1 direction relative to the conductor pattern 114a, and an area positioned in the Y1 direction relative to the conductor pattern 114b.

The semiconductor chips 12 (12p and 12n) are power semiconductor devices capable of high-current switching. Specifically, each of the semiconductor chips 12 may include a transistor such as an IGBT (Insulated Gate Bipolar Transistor) or a MOSFET (Metal-Oxide-Semiconductor Field-Effect Transistor), an RC-IGBT (Reverse Conducting IGBT), an FWD (Freewheeling Diode), or the like. In the first embodiment, it is assumed that the semiconductor chip 12 is the RC-IGBT including an IGBT portion and an FWD portion.

Each of the semiconductor chips 12 (12p and 12n) includes a main electrode E, a main electrode C, and a control electrode G. A current to be controlled is input into or output from the main electrode E and the main electrode C. Specifically, the main electrode E is an emitter electrode formed on the topside of the semiconductor chip 12, and the main electrode C is a collector electrode formed on the underside of the semiconductor chip 12. The main electrode C also functions as an anode electrode of an FWD portion. The main electrode E also functions as a cathode electrode of the FWD portion. In addition, the control electrode G is a gate electrode formed on the topside of the semiconductor chip 12, and applied with a voltage for controlling the semiconductor chip 12 to turn ON and OFF. The control electrode G may include a detection electrode to be used for current detection, temperature detection, or other detection. In the first embodiment, the semiconductor chip 12n is an example of a "first semiconductor chip," and the main electrode E of the semiconductor chip 12n is an example of a "first main electrode." In addition, the semiconductor chip 12p is an example of a "second semiconductor chip," and the main electrode C of the semiconductor chip 12p is an example of a "second main electrode."

As exemplified in FIG. 2, the semiconductor chips 12 (12p and 12n) are joined to the layered substrate 11 by using a joining member 15 such as one of solder. Specifically, as exemplified in FIG. 1, the semiconductor chip 12p is joined to the conductor pattern 114a. That is, the main electrode C of the semiconductor chip 12p is joined to the conductor pattern 114a. The semiconductor chip 12n is joined to the conductor pattern 114c of the layered substrate 11. That is, the main electrode C of the semiconductor chip 12n is joined to the conductor pattern 114c.

The wiring portion 13p in FIG. 1 is a wire that electrically connects the main electrode E of the semiconductor chip 12p and the conductor pattern 114c. The wiring portion 13p extends in the Y-axis direction. One end portion of the wiring portion 13p, which is positioned in the Y2 direction, is joined to the main electrode E of the semiconductor chip 12p. The other end portion of the wiring portion 13p, which is positioned in the Y1 direction, is joined to the conductor pattern 114c. In addition, the wiring portion 13n is a wire that electrically connects the main electrode E of the semiconductor chip 12n and the conductor pattern 114b. The wiring portion 13n extends in the Y-axis direction. One end portion of the wiring portion 13n, which is positioned in the Y1 direction, is joined to the main electrode E of the semiconductor chip 12n. The other end portion of the wiring portion 13n, which is positioned in the Y2 direction, is joined to the conductor pattern 114b. The wiring portions 13p and 13n are lead frames made of a low-resistance conductive material such as copper or copper alloy.

The connection conductors 14 (14p, 14n, and 14o) are made of a low-resistance conductive material such as copper or copper alloy. The connection conductor 14p electrically connects the semiconductor chip 12p to an external device (not illustrated). Specifically, the connection conductor 14p is joined to the surface of the conductor pattern 114a by using a joining member (not illustrated) such as one of solder. That is, the connection conductor 14p is electrically connected to the main electrode C of the semiconductor chip 12p through the conductor pattern 114a. The connection conductor 14p is positioned in the Y2 direction when viewed from the semiconductor chip 12p and the wiring portion 13p. As will be understood from the above explanation, the semiconductor chip 12p, the wiring portion 13p, and the connection conductor 14p are installed in the space in the X1 direction when viewed from the reference plane R.

The connection conductor 14n electrically connects the semiconductor chip 12n to the external device. Specifically, the connection conductor 14n is joined to the surface of the conductor pattern 114b by way of a joining member (not illustrated) such as one of solder. That is, the connection conductor 14n is electrically connected to the main electrode E of the semiconductor chip 12n through the conductor pattern 114b and the wiring portion 13n. The connection conductor 14n is positioned in the Y2 direction when viewed from the semiconductor chip 12n and the wiring portion 13n. As will be understood from the above explanation, the semiconductor chip 12n, the wiring portion 13n, and the connection conductor 14n are installed in the space in the X2 direction when viewed from the reference plane R. The connection conductors 14p and 14n are arrayed in the X-axis direction and are spaced apart from each other. The connection conductor 14n according to the first embodiment is an example of a "first connection conductor."

The connection conductor 14o electrically connects the conductor pattern 114c to the external device. Specifically, the connection conductor 14o is joined to the surface of the conductor pattern 114c by way of a joining member (not illustrated) such as one of solder. That is, the connection conductor 14o is electrically connected to the main electrode E of the semiconductor chip 12p through the conductor pattern 114c and the wiring portion 13p, while being electrically connected to the main electrode C of the semiconductor chip 12n through the conductor pattern 114c.

As exemplified in FIG. 2, each of the connection conductors 14p, 14n, and 14o is a columnar structure protruding from the layered substrate 11 in the Z1 direction. Each of the connection conductors 14 has a rectangular shape when viewed in plan. That is, each of the connection conductors 14 according to the first embodiment is a cuboid. The top face of the connection conductor 14p, the top face of the connection conductor 14n, and the top face of the connection conductor 14o are positioned higher than the other elements of the semiconductor unit 10. That is, in the Z-axis direction, the top face of each connection conductor 14 is positioned in the Z1 direction relative to the layered substrate 11, the respective wiring portion 13, and the respective semiconductor chip 12.

The casing portion 20 in FIG. 1 is a frame-shaped structure that surrounds the semiconductor unit 10. Specifically, the underside of the casing portion 20 is joined to the edge portion of the topside of the base portion 30 by, for example, using an adhesive. The semiconductor unit 10 is accommodated in the casing portion 20 with the side of the layered substrate 11 (the insulating substrate 112) spaced apart from, and opposed to, the inner wall surface of the casing portion 20. The inner wall surface of the casing portion 20 is a wall surface (inner peripheral surface) that faces toward the center of the casing portion 20 in plan view. The casing portion 20 is made of a resin material such as PPS (polyphenylene sulfide) resin, PBT (polybutylene terephthalate) resin, PBS (poly butylene succinate) resin, PA (polyamide) resin, or ABS (acrylonitrile-butadiene-styrene) resin, or other kinds of resin materials. A filler made of an insulating material may be contained in the casing portion 20.

As exemplified in FIG. 1, the casing portion 20 according to the first embodiment is a rectangular frame-shaped structure having a side wall 21, a side wall 22, a side wall 23, and a side wall 24 connected with each other in the described order. The side walls 21 and 23 are wall portions extending in the Y-axis direction at a predetermined spacing from each other in the X-axis direction. The side walls 22 and 24 are wall portions extending in the X-axis direction at a predetermined spacing from each other in the Y-axis direction. The side walls 22 and 24 are shaped so as to connect the respective end portions of the side walls 21 and 23 with each other. The connection conductors 14p and 14n in the semiconductor unit 10 are arrayed parallel to the side wall 22 at a position away from the inner wall surface of the side wall 22 in the Y1 direction, and are spaced apart from each other.

As exemplified in FIG. 2, a primer film 25 is formed on the inner wall surface of the casing portion 20. The primer film 25 is a coating that coats the inner wall surface of the casing portion 20. The primer film 25 functions as a primer to improve the adhesion between the inner wall surface of the casing portion 20 and the sealing element 40. The primer film 25 is made of an appropriate resin material in accordance with the material of the casing portion 20 and the material of the sealing element 40. Specifically, the primer film 25 is made of, for example, a silane coupling agent. For example, the primer film 25 may be made of polyimide resin, polyamide-imide resin, polyamide resin, or modifications thereof. In FIG. 1, illustration of the primer film 25 is omitted for convenience.

As exemplified in FIG. 1, a connection terminal 26 and control terminals 27 are installed on the side wall 24 of the casing portion 20. The connection terminal 26 is a plate-like conductor penetrating through the side wall 24 in the Y-axis direction. A portion of the connection terminal 26, protruding from the inner wall surface of the side wall 24, is joined to the top face of the connection conductor 14o. That is, the connection terminal 26 is electrically connected to the main electrode E of the semiconductor chip 12p through the connection conductor 14o, the conductor pattern 114c, and the wiring portion 13p, while being electrically connected to the main electrode C of the semiconductor chip 12n through the connection conductor 14o and the conductor pattern 114c. As will be understood from the above explanation, the connection terminal 26 is an output terminal (0 terminal) to electrically connect each of the semiconductor chips 12 (12p and 12n) to the external device.

The control terminals 27 are lead terminals to electrically connect the control electrode G of each of the semiconductor chips 12 to the external device. Each of the control terminals 27 is electrically connected to the control electrode G of each of the semiconductor chips 12 (12p and 12n) by, for example, wires 28. The control terminals 27, the connection terminal 26, and the connector 50 described above are formed as one piece with the casing portion 20 by, for example, insert molding.

The connector 50 is a terminal to electrically connect the semiconductor unit 10 to the external device. As exemplified in FIGS. 1 and 2, the connector 50 is made up of layers of a connection terminal 51p, an insulating sheet 52, and a connection terminal 51n. Connection terminals 51 (51p and 51n) are thin plate-like electrodes made of a low-resistance conductive material such as copper or copper alloy. Each of the connection terminals 51 may be coated with a conductive material such as nickel or nickel alloy.

Each of the connection terminals 51p and 51n may have a thickness, for example, equal to or greater than 0.2 mm, and equal to or less than 2.5 mm. In a preferred aspect, the connection terminals 51p and 51n have an equivalent thickness. In the present specification, the description "the dimension "a" and the dimension "b" are "equivalent to each other" (a≠b)" includes the case in which the dimension "a" and the dimension "b" perfectly correspond with each other, and additionally includes cases in which the dimension "a" and the dimension "b" substantially correspond to each other. The case in which "the dimension "a" and the dimension "b" substantially correspond to each other" refers to a case in which, for example, the difference between the dimension "a" and the dimension "b" falls within the range of manufacturing error. Specifically, the case in which the ratio of the dimension "b" to the dimension "a" is equal to or greater than 90% and equal to or less than 110% (more preferably, equal to or greater than 95% and equal to or less than 105%) is construed to be the dimension "a" and the dimension "b" being "equivalent to each other."

The insulating sheet 52 is a thick film or a thin film made of an insulating material and having insulation properties. For example, insulating paper is preferably used as the insulating sheet 52. The insulating sheet 52 may have a thickness equal to or greater than 0.05 mm, and equal to or less than 2.5 mm.

As exemplified in FIGS. 1 and 2, the connection terminal 51p, the insulating sheet 52, and the connection terminal 51n are layered in the described order from the top in the Z2 direction. Specifically, the insulating sheet 52 is layered between the connection terminal 51p and the connection terminal 51n. The connection terminal 51p is positioned in the Z1 direction relative to the insulating sheet 52. The connection terminal 51n is positioned in the Z2 direction relative to the insulating sheet 52. Specifically, the connection terminal 51p adheres to the topside of the insulating sheet 52, while the connection terminal 51n adheres to the underside of the insulating sheet 52.

The connection terminal 51p is a positive input terminal (P terminal) to electrically connect the semiconductor chip 12p to the external device. The connection terminal 51n is a negative input terminal (N terminal) to electrically connect the semiconductor chip 12n to the external device. That is, the connection terminal 51p has a higher applied voltage as compared to the connection terminal 51n. The connection terminals 51p and 51n are electrically insulated from each other by the insulating sheet 52. In the configuration as described above in which the connection terminals 51p and 51n are opposed to each other with the insulating sheet 52 sandwiched therebetween, induction components associated with the current path of the semiconductor module 100 are reduced. In the first embodiment, the connection terminal 51n is an example of a "first connection terminal," whereas the connection terminal 51p is an example of a "second connection terminal."

As exemplified in FIG. 1, the connection terminal 51p includes a conductor portion 511p and a terminal portion 512p. The conductor portion 511p is a rectangular portion including a peripheral edge Ep1 and a peripheral edge Ep2. The peripheral edge Ep1 is an edge of the conductor portion 511p positioned in the Y1 direction. The peripheral edge Ep2 is an edge of the conductor portion 511p positioned on the opposite side (in the Y2 direction) to the peripheral edge Ep1. The peripheries Ep1 and Ep2 both extend in the X-axis direction. The terminal portion 512p is a rectangular portion extending in the Y1 direction from the peripheral edge Ep1 of the conductor portion 511p. Specifically, the terminal portion 512p continues from a part of the conductor portion 511p positioned in the X1 direction relative to the reference plane R. The terminal portion 512p is also expressed as a portion with a transverse width narrower than that of the conductor portion 511p. Specifically, the terminal portion 512p has a transverse width narrower than half the transverse width of the conductor portion 511p. In the present specification, the term "transverse width" refers to the dimension in the X-axis direction. The conductor portion 511p is an example of a "second conductor portion." The peripheral edge Ep1 is an example of a "second peripheral edge."

In substantially the same manner as for the connection terminal 51p, the connection terminal 51n includes a conductor portion 511n and a terminal portion 512n. The conductor portion 511n is a rectangular portion including a peripheral edge En1 and a peripheral edge En2. The peripheral edge En1 is an edge of the conductor portion 511n positioned in the Y1 direction. The peripheral edge En2 is an edge of the conductor portion 511n positioned on the opposite side (in the Y2 direction) to the peripheral edge En1. The peripheries En1 and En2 both extend in the X-axis direction. The terminal portion 512n is a rectangular portion extending in the Y1 direction from the peripheral edge En1 of the conductor portion 511n. Specifically, the terminal portion 512n continues from a part of the conductor portion 511n positioned in the X2 direction relative to the reference plane R. The terminal portion 512n is also expressed as a portion with a transverse width (the dimension in the X-axis direction) narrower than that of the conductor portion 511n. Specifically, the terminal portion 512n has a transverse width narrower than half the transverse width of the conductor portion 511n. The conductor portion 511n is an example of a "first conductor portion." The terminal portion 512n is an example of a "first terminal portion." The peripheral edge En1 of the conductor portion 511n is an example of a "first peripheral edge."

In the first embodiment, the peripheral edge Ep1 of the connection terminal 51p is aligned with the peripheral edge En1 of the connection terminal 51n in the Y-axis direction. However, the peripheries Ep1 and En1 may be at different positions with each other in the Y-axis direction. The X-axis direction is also expressed as a direction extending along the peripheral edge Ep1 or the peripheral edge En1. The X-axis direction is an example of a "first direction."

The conductor portions 511p and 511n overlap one over the other in plan view. Specifically, at least a part of the conductor portion 511p and at least a part of the conductor portion 511n overlap one over the other in plan view. More specifically, the transverse width of the conductor portion 511p is equivalent to the transverse width of the conductor portion 511n. The conductor portions 511p and 511n are arranged at the same position in the X-axis direction. On the other hand, the terminal portions 512p and 512n do not overlap one over the other in plan view. Specifically, the terminal portion 512p is positioned in the X1 direction relative to the reference plane R in plan view, whereas the terminal portion 512n is positioned in the X2 direction relative to the reference plane R in plan view. The reference plane R includes the center line of each of the conductor portions 511p and 511n in their width directions. Therefore, the terminal portions 512p and 512n are positioned on opposite sides to each other with the center line sandwiched therebetween. In the configuration described above, the conductor portions 511p and 511n overlap one over the other, so that the induction components associated with the current path of the semiconductor module 100 are reduced as described above. In addition, due to the configuration in which the terminal portions 512p and 512n do not overlap one over the other, electrical insulation is enabled between the terminal portions 512p and 512n.

Figure 3:
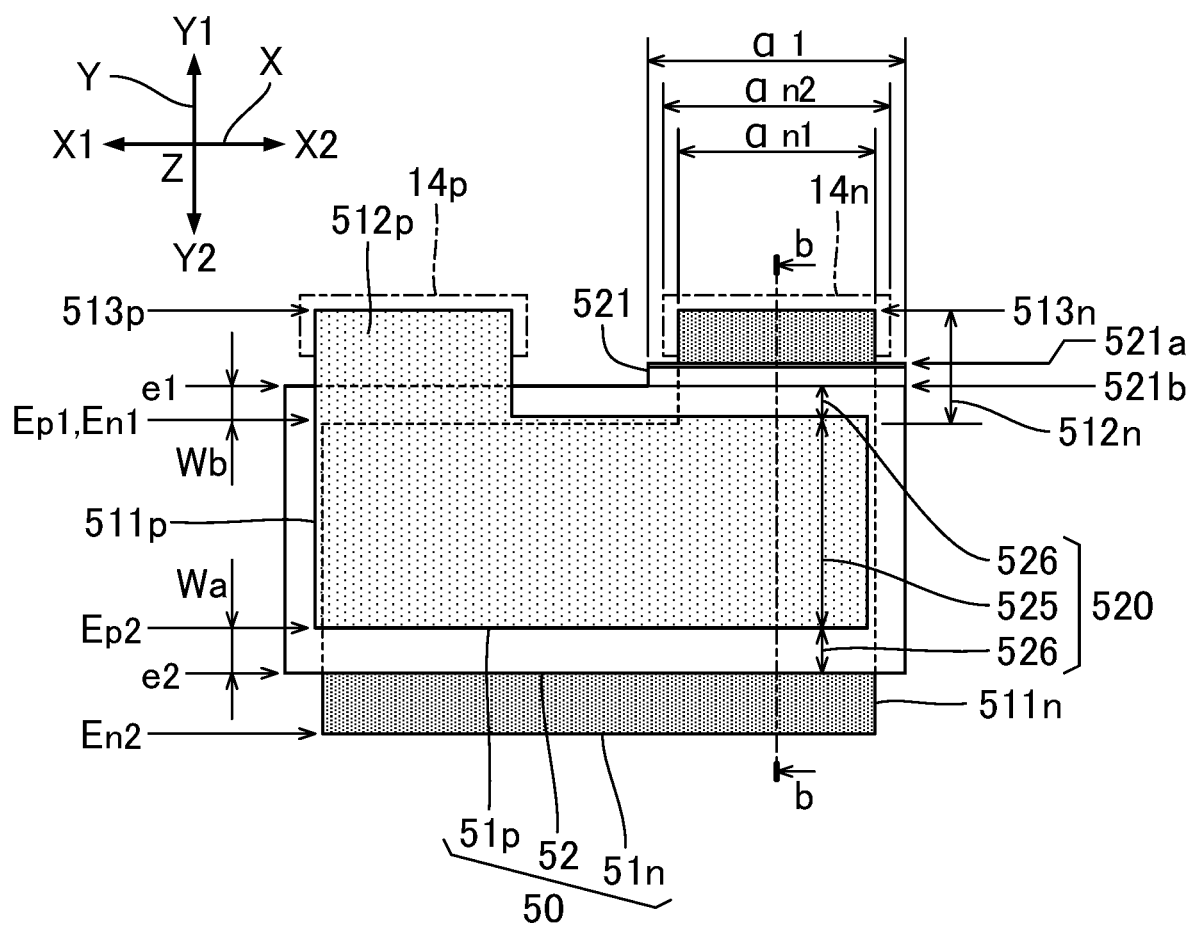
FIG. 3 is a plan view of a connection portion.

FIG. 3 is a plan view of the connector 50. As exemplified in FIGS. 1 and 3, the insulating sheet 52 includes a main body portion 520 and a protruding portion 521. The main body portion 520 is a rectangular portion including a peripheral edge e1 and a peripheral edge e2. The peripheral edge e1 is an edge of the main body portion 520 positioned in the Y1 direction. The peripheral edge e2 is an edge of the main body portion 520 positioned on the opposite side (in the Y2 direction) to the peripheral edge e1. The peripheries e1 and e2 both extend in the X-axis direction. The main body portion 520 of the insulating sheet 52 has a transverse width (that is, the dimension in the X-axis direction) greater than the transverse width of each of the connection terminals 51p and 51n. In the X-axis direction, the connection terminals 51p and 51n are positioned within the range of transverse width of the main body portion 520.

As exemplified in FIG. 3, the main body portion 520 includes an insulating portion 525 and a peripheral edge portion 526. The insulating portion 525 is a rectangular portion layered between the conductor portion 511p of the connection terminal 51p and the conductor portion 511n of the connection terminal 51n. Specifically, the insulating portion 525 overlaps the conductor portion 511p of the connection terminal 51p in plan view. In addition, the peripheral edge portion 526 is a portion that continues from the insulating portion 525 in a flush manner. The peripheral edge portion 526 surrounds the insulating portion 525. The peripheral edge portion 526 according to the first embodiment surrounds the insulating portion 525 over its entire peripheral edge.

The peripheral edge e1 of the main body portion 520 of the insulating sheet 52 is positioned between the peripheral edge Ep1 of the conductor portion 511p of the connection terminal 51p and a tip portion 513p of the terminal portion 512p. The peripheral edge e1 is also positioned between the peripheral edge En1 of the conductor portion 511n of the connection terminal 51n and a tip portion 513n of the terminal portion 512n. Therefore, as exemplified in FIGS. 1 and 3, a part of the terminal portion 512p of the connection terminal 51p, positioned closer to the tip portion 513p, protrudes from the peripheral edge e1 of the insulating sheet 52 in the Y1 direction. Also, a part of the terminal portion 512n of the connection terminal 51n, positioned closer to the tip portion 513n, protrudes from the peripheral edge e1 of the insulating sheet 52 in the Y1 direction. Tip portions 513 of terminal portions 512 each are, of the respective terminal portion 512, a peripheral edge positioned in the Y1 direction. Each of the tip portions 513 is also expressed as a portion that is furthest away from the peripheral edge e1 of the insulating sheet 52 in the Y1 direction.

In addition, the peripheral edge e2 of the main body portion 520 is positioned between the peripheral edge Ep2 of the conductor portion 511p of the connection terminal 51p and the peripheral edge En2 of the conductor portion 511n of the connection terminal 51n. Specifically, the peripheral edge Ep2 of the conductor portion 511p is positioned in the Y1 direction relative to the peripheral edge e2 of the main body portion 520. Also, the peripheral edge En2 of the conductor portion 511n is positioned in the Y2 direction relative to the peripheral edge e2 of the main body portion 520. That is, a part of the main body portion 520 extending along the peripheral edge e2 of the main body portion 520 extends beyond the peripheral edge Ep2 of the conductor portion 511*p* in the Y2 direction. Also, a part of the conductor portion 511*n* lying along the peripheral edge En2 extends beyond the peripheral edge e2 of the main body portion 520 in the Y2 direction.

A spacing Wa between the peripheral edge Ep2 of the conductor portion 511*p* and the peripheral edge e2 of the insulating sheet 52 is set to a dimension of, for example, 10 mm or more. The spacing Wa is a creepage distance between the connection terminal 51*n* and the peripheral edge Ep2 of the connection terminal 51*p*. A spacing Wb between the peripheral edge Ep1 of the conductor portion 511*p* (or the peripheral edge En1 of the conductor portion 511*n*) and the peripheral edge e1 of the main body portion 520 is smaller than the spacing Wa (Wb<Wa).

As exemplified in FIGS. 1 and 2, the connector 50 penetrates through the side wall 22 of the casing portion 20 in the Y-axis direction. Specifically, the area, including a part of the conductor portion 511*p* of the connection terminal 51*p*, positioned closer to the peripheral edge Ep1, and also including the entire part of the terminal portion 512*p*, protrudes from the inner wall surface of the side wall 22 in the Y1 direction. In substantially the same manner as described above, the area, including a part of the conductor portion 511*n* of the connection terminal 51*n*, positioned closer to the peripheral edge En1, and also including the entire part of the terminal portion 512*n*, protrudes from the inner wall surface of the side wall 22 in the Y1 direction. The terminal portion 512*p* and the peripheral edge Ep1 of the connection terminal 51*p*, as well as the terminal portion 512*n* and the peripheral edge Ent of the connection terminal 51*n*, are sealed by the sealing element 40 in the inner space of the casing portion 20. Therefore, the spacing Wa described above is positioned outside the casing portion 20, whereas the spacing Wb described above is positioned inside the casing portion 20. As described above, since the spacing Wb is smaller than the spacing Wa, the casing portion 20 can be reduced in size compared to the configuration in which the spacing Wb is equal to or greater than the spacing Wa. In addition, since the inner space of the casing portion 20 is filled with the sealing element 40, electrical insulation between the connection terminals 51*p* and 51*n* is still possible even in the configuration in which the spacing Wb is smaller than the spacing Wa.

FIG. 3 illustrates the outline shape of the connection conductors 14 (14*p* and 14*n*) by the dotted-dashed line. As exemplified in FIGS. 1 and 3, the terminal portion 512*p* of the connection terminal 51*p*, which extends in the Y1 direction from the peripheral edge e1 of the insulating sheet 52, overlaps the connection conductor 14*p* in plan view. The terminal portion 512*p* is joined to the topside of the connection conductor 14*p* by, for example, laser welding. That is, the connection terminal 51*p* is electrically connected to the main electrode C of the semiconductor chip 12*p* through the connection conductor 14*p* and the conductor pattern 114*a*.

In substantially the same manner as described above, the terminal portion 512*n* of the connection terminal 51*n*, which extends in the Y1 direction from the peripheral edge e1 of the insulating sheet 52, overlaps the connection conductor 14*n* in plan view. The terminal portion 512*n* is joined to the topside of the connection conductor 14*n* by, for example, laser welding. That is, the connection terminal 51*n* is electrically connected to the main electrode E of the semiconductor chip 12*n* through the connection conductor 14*n*, the conductor pattern 114*b*, and the wiring portion 13*n*.

The protruding portion 521 of the insulating sheet 52 continues from the main body portion 520, and the protruding portion 521 and the main body portion 520 comprise a single piece. As exemplified in FIGS. 1 and 3, the protruding portion 521 according to the first embodiment is a rectangular portion extending in the Y1 direction from the peripheral edge e1 of the main body portion 520. Specifically, the protruding portion 521 continues from, of the main body portion 520, a part positioned in the X2 direction relative to the reference plane R. That is, the protruding portion 521 has a transverse width in the X-axis direction (the dimension of a range α1) narrower than the transverse width of the main body portion 520. For example, the protruding portion 521 has a transverse width narrower than half the transverse width of the main body portion 520. A base end portion 521*b* illustrated in FIG. 3 is, of the protruding portion 521, a part positioned in the vicinity of the boundary (the peripheral edge e1) between the protruding portion 521 and the main body portion 520. A tip portion 521*a* is the end of the protruding portion 521 on the opposite side to the base end portion 521*b*. The protruding portion 521 is an example of a "first protruding portion."

Figure 4:
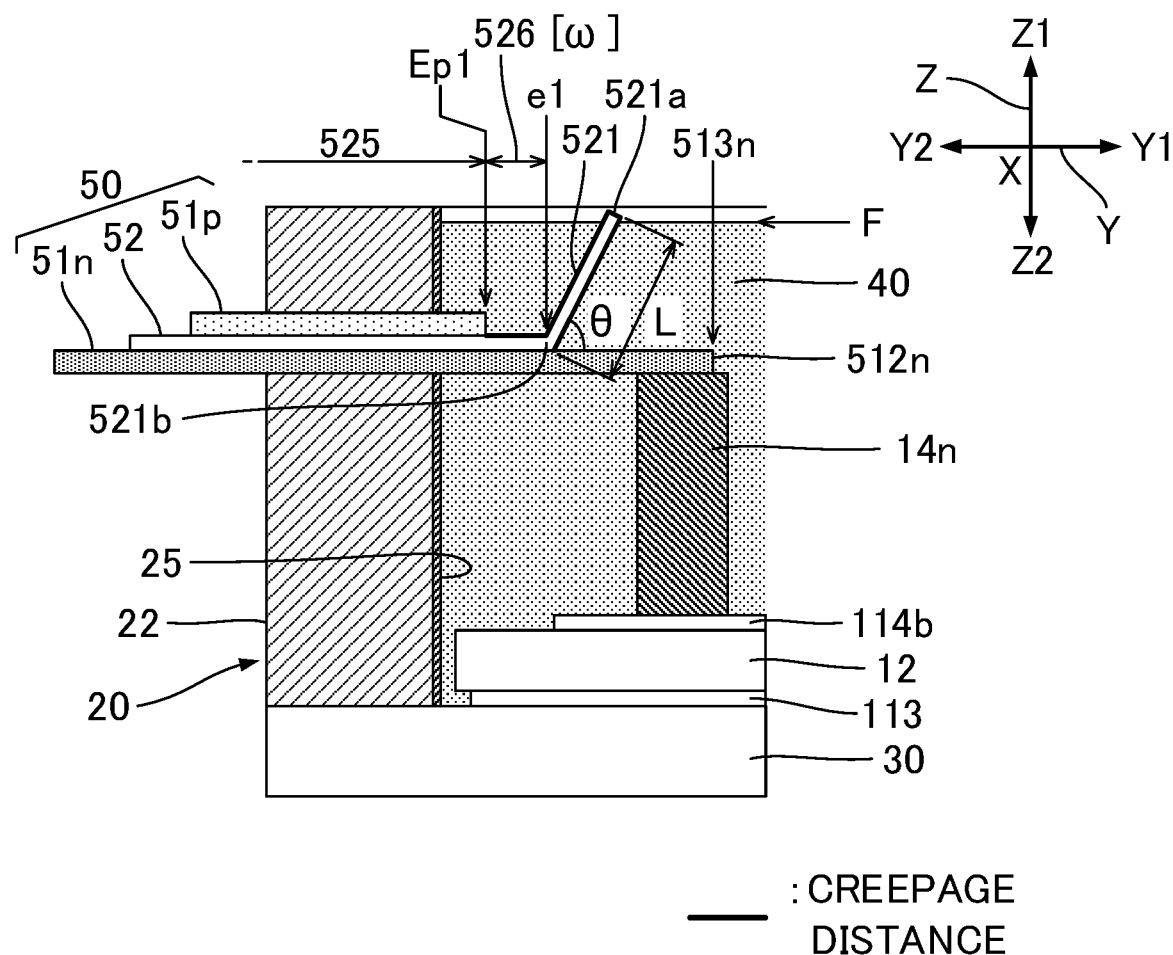
FIG. 4 is an enlarged cross-sectional diagram of the vicinity of a protruding portion.

FIG. 4 is an enlarged cross-sectional diagram of the semiconductor module 100, illustrating the vicinity of the protruding portion 521. FIG. 4 illustrates the connector 50 in cross-section taken along a line b-b in FIG. 3. As exemplified in FIG. 4, the protruding portion 521 forms an angle θ relative to the topside of the terminal portion 512*n*. That is, the protruding portion 521 is inclined relative to (or perpendicular to) the topside of the terminal portion 512*n*, such that the tip portion 521*a* is positioned in the Z1 direction relative to the base end portion 521*b*. That is, the protruding portion 521 protrudes upward (for example, vertically or obliquely upward) from the topside of the terminal portion 512*n*.

The angle θ is a numerical value ranging from, for example, 45° to 135°, and is more preferably a numerical value ranging from, for example, 60° to 120°. Even more preferably, the angle θ is a numerical value ranging from, for example, 80° to 100°, and is set to, for example, 90°. The angle θ is also expressed as an angle of the protruding portion 521 relative to the main body portion 520 (the insulating portion 525 and the peripheral edge portion 526). The angle θ between the main body portion 520 and the protruding portion 521 is formed by bending the insulating sheet 52 at the boundary extending along the peripheral edge e1 of the main body portion 520. That is, the protruding portion 521 continues from the main body portion 520 of the insulating sheet 52, the protruding portion 521, and the main body portion comprising a single piece. The main body portion 520 is an example of "another portion of the insulating sheet."

As described above, the protruding portion 521 protrudes upward from the terminal portion 512*n* or from the main body portion 520. Therefore, as will be understood from FIGS. 2 and 4, the protruding portion 521 is positioned between the connection terminal 51*n* (the terminal portion 512*n*) and a surface F of the sealing element 40. That is, in the first embodiment, the protruding portion 521 extends from the topside of the terminal portion 512*n* toward the surface F of the sealing element 40. As exemplified in FIGS. 2 and 4, the tip portion 521*a* of the protruding portion 521 protrudes from the surface F of the sealing element 40. That is, the tip portion 521*a* is exposed from the sealing element 40. According to the above form, for example, a worker can easily perform visual inspection from the outside of the sealing element 40 to confirm that the protruding portion 521 is properly formed.

As exemplified in FIGS. 1 and 3, the protruding portion 521 is positioned between the tip portion 513n of the terminal portion 512n and the peripheral edge Ep1 of the connection terminal 51p in plan view. That is, both the tip portion 521a and the base end portion 521b of the protruding portion 521 are positioned between the tip portion 513n and the peripheral edge Ep1 in plan view. The protruding portion 521 does not overlap the connection conductor 14n in plan view. That is, both the tip portion 521a and the base end portion 521b of the protruding portion 521 are positioned in the Y2 direction when viewed from the connection conductor 14n.

As exemplified in FIG. 4, the protruding portion 521 according to the first embodiment is connected with the insulating portion 525 through the peripheral edge portion 526. That is, the peripheral edge portion 526 is positioned between the protruding portion 521 and the insulating portion 525 in plan view. The peripheral edge portion 526 corresponds to a portion connecting the protruding portion 521 and the insulating portion 525 together (i.e., the peripheral edge portion 526 is a connecting portion). As will be understood from the above explanation, the protruding portion 521 protrudes upward from the position (the base end portion 521b) away from the peripheral edge Ep1 of the connection terminal 51p by a width dimension (the dimension in the Y-axis direction) w of the peripheral edge portion 526 in the Y1 direction.

In addition, the insulating sheet 52 may separate from the sealing element 40 in some cases, such separation being caused by residual stress in the insulating sheet 52 or the sealing element 40, thermal stress due to a difference in linear expansion coefficient between the insulating sheet 52 and the sealing element 40, or due to other stress. According to the first embodiment, even when the insulating sheet 52 separates from the sealing element 40, sufficient creepage distance between the terminal portion 512n and the connection terminal 51p can still remain. The above effects are described below in detail.

Figure 5:
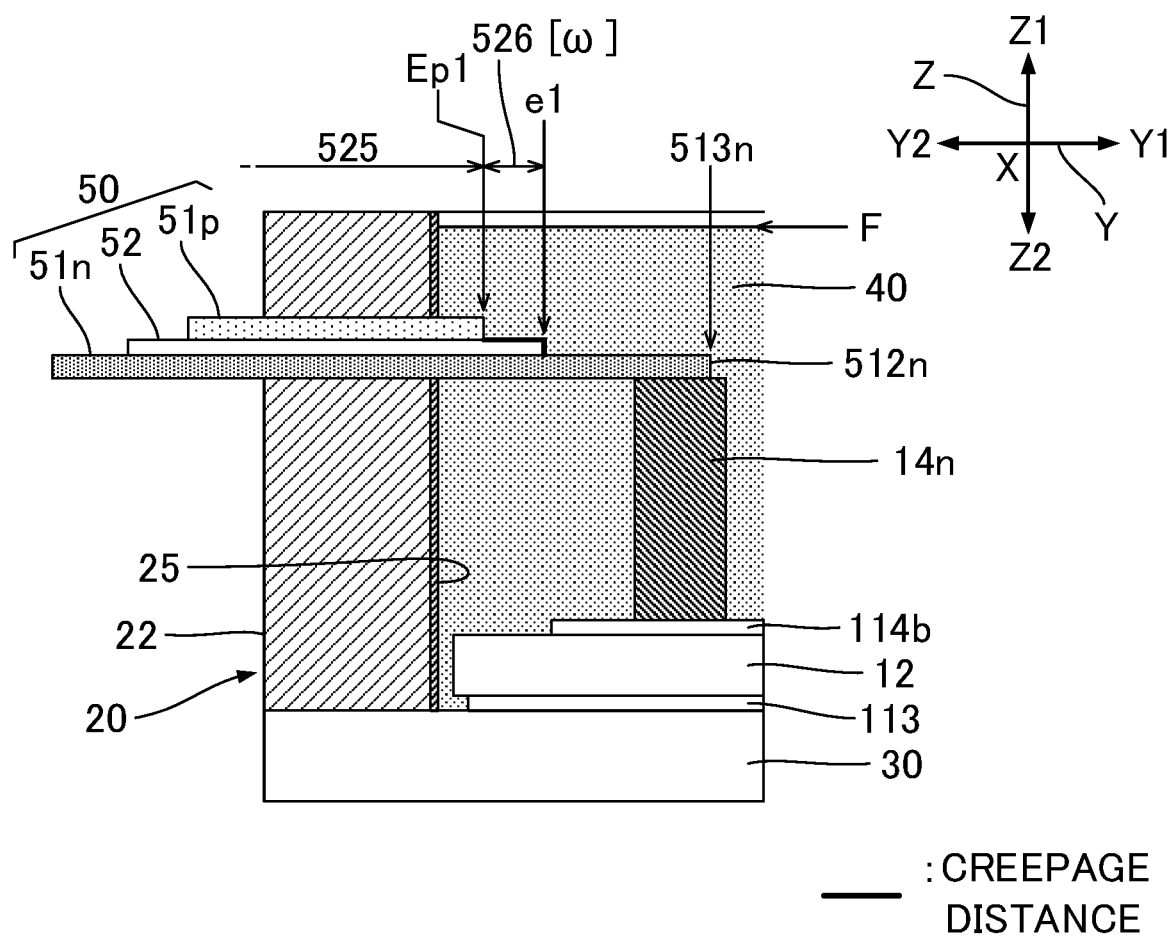
FIG. 5 is a cross-sectional diagram illustrating a comparative example.

FIG. 5 is a cross-sectional diagram illustrating a form to be compared to the first embodiment (hereinafter, referred to as "comparative example"). The comparative example omits the protruding portion 521 according to the first embodiment. In the comparative example, when the insulating sheet 52 separates from the sealing element 40, the creepage distance between the terminal portion 512n and the connection terminal 51p is a sum of the value of a dimension w of the peripheral edge portion 526 of the insulating sheet 52 extending beyond the connection terminal 51p, and the value of thickness of the insulating sheet 52. In the above state, no sufficient creepage distance remains between the connection terminal 51p and the terminal portion 512n. Consequently, there is a possibility of insufficient electrical insulation between the connection terminals 51p and 51n.

In contrast to the comparative example, in the first embodiment as exemplified in FIG. 4, the protruding portion 521 that forms the angle θ relative to the terminal portion 512n is positioned between the tip portion 513n of the terminal portion 512n and the peripheral edge Ep1 of the connection terminal 51p in plan view. Therefore, when the insulating sheet 52 separates from the sealing element 40, the creepage distance between the terminal portion 512n and the connection terminal 51p is a sum of the value of dimension w of the peripheral edge portion 526 of the insulating sheet 52, and the value of approximately twice the extension length L of the protruding portion 521, as will be understood from FIG. 4. That is, according to the first embodiment, a sufficient creepage distance between the connection terminal 51p and the terminal portion 512n is left compared to in the comparative example. Therefore, the first embodiment has an advantage that electrical insulation between the connection terminals 51p and 51n can be effectively maintained. In the first embodiment, the dimension w of the peripheral edge portion 526, and the extension length L of the protruding portion 521 are set in such a manner that, when the sealing element 40 is not in contact with the insulating sheet 52, the creepage distance between the connection terminal 51p and the terminal portion 512n is equal to or greater than the creepage distance Wa between the connection terminals 51p and 51n on the outside of the casing portion 20.

Even in the comparative example in FIG. 5, if a sufficient dimension w of the peripheral edge portion 526 can remain, it is still possible to leave a sufficient creepage distance between the terminal portion 512n and the connection terminal 51p. However, in a configuration in which the dimension w of the peripheral edge portion 526 is excessively long, the size of the casing portion 20 (accordingly, the size of the semiconductor module 100) in the Y-axis direction will be excessively large. According to the first embodiment, the protruding portion 521, which forms the angle θ relative to the terminal portion 512n, enables a sufficient creepage distance between the terminal portion 512n and the connection terminal 51p to remain, so that the casing portion 20 is reduced in size in the Y-axis direction as compared to in the comparative example. Thus, according to the first embodiment, electrical insulation between the connection terminals 51p and 51n can be maintained, whereas an increase in the size of the semiconductor module 100 is still reduced or avoided.

As exemplified in FIG. 3, the range α1 of the protruding portion 521 in the X-axis direction includes a range and of the terminal portion 512n in the X-axis direction. That is, the range α1 is wider than the range αn1, and each end of the range αn1 is within the range α1. The configuration described above facilitates sufficient creepage distance to remain between the terminal portion 512n and the connection terminal 51p, as compared to the configuration in which the range αn1 of the terminal portion 512n is partially outside the range α1 of the protruding portion 521. Accordingly, electrical insulation between the connection terminals 51p and 51n can be maintained effectively.

In the first embodiment, the range α1 of the protruding portion 521 in the X-axis direction further includes a range αn2 of the connection conductor 14n in the X-axis direction. That is, the range α1 is greater than the range αn2, and each end of the range αn2 is positioned within the range α1. The configuration described above facilitates sufficient creepage distance to remain between the connection conductor 14n and the connection terminal 51p, as compared to the configuration in which the range αn2 of the connection conductor 14n is partially positioned outside the range α1 of the protruding portion 521. Accordingly, electrical insulation between the connection terminals 51p and 51n can be maintained effectively.

As described above, in the first embodiment, the protruding portion 521 does not overlap the connection conductor 14n in plan view. Therefore, the terminal portion 512n is more easily joined to the connection conductor 14n as compared to the configuration in which, for example, the protruding portion 521 overlaps the connection conductor 14n in plan view. The terminal portion 512n can be easily joined to the connection conductor 14n by, for example, laser welding.

A-2: Manufacturing Method for Semiconductor Module 100

Figure 6:
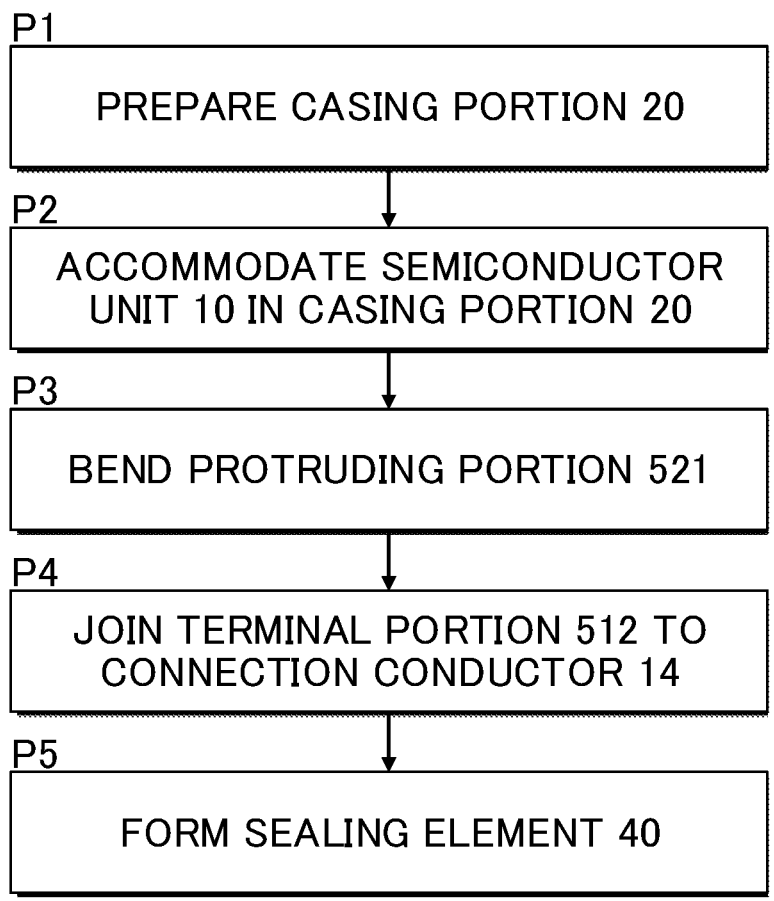
FIG. 6 is a process flowchart exemplifying a manufacturing method of the semiconductor module.
Figure 7:
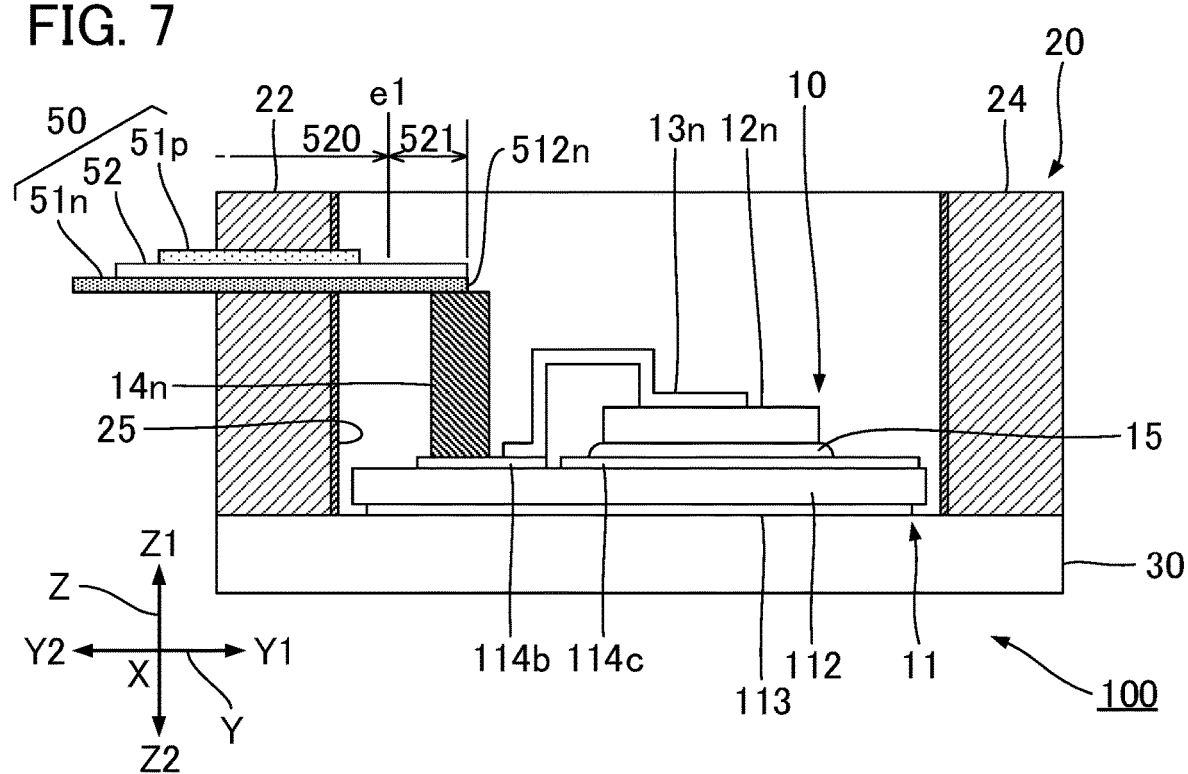
FIG. 7 is a cross-sectional diagram exemplifying a step in the middle of a manufacturing process.

FIG. 6 is a process flowchart exemplifying a manufacturing method of the semiconductor module 100 explained above. First, in a process P1, the casing portion 20 having the connector 50 installed therein is prepared. At the stage of the process P1, the insulating sheet 52 made of insulating paper is in planar form, as exemplified in FIG. 7. That is, the protruding portion 521 of the insulating sheet 52 is in the state of being parallel to the main body portion 520. In the state described above, the protruding portion 521 partially overlaps the connection conductor 14n in plan view. In a process P2 after performing the process P1, the semiconductor unit 10 is accommodated in the inner space of the casing portion 20.

Figure 8:
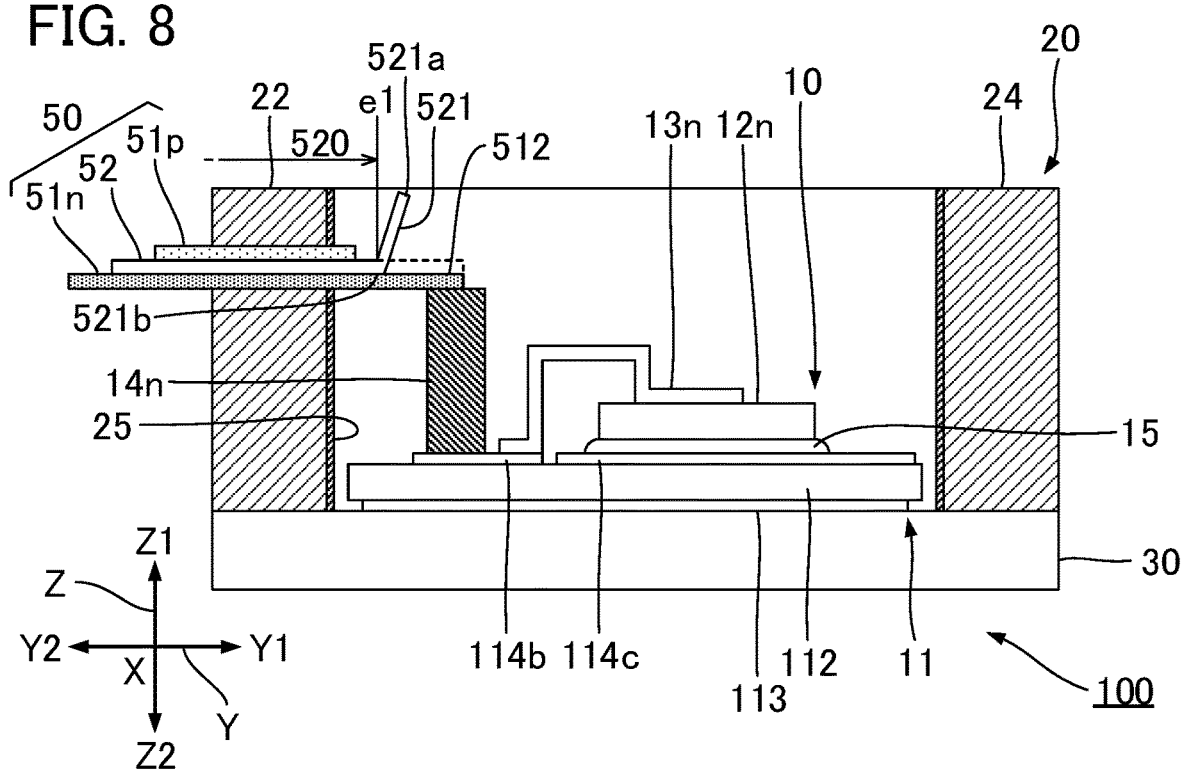
FIG. 8 is a cross-sectional diagram exemplifying the step in the middle of the manufacturing process.

In a process P3 after performing the process P2, the protruding portion 521 of the insulating sheet 52 is bent with respect to the main body portion 520, as exemplified in FIG. 8. Specifically, the protruding portion 521 is bent upward along the peripheral edge e1 in such a manner as to form the predetermined angle θ relative to the terminal portion 512n of the connection terminal 51n. Therefore, after performing the process P3, the protruding portion 521 does not overlap the connection conductor 14n in plan view, as described above. Accommodating the semiconductor unit 10 in the casing portion 20 (P2), and bending the insulating sheet 52 (P3) may be performed in the reverse order. That is, after the bending of the protruding portion 521, the semiconductor unit 10 may be accommodated in the casing portion 20. The process P3 is an example of a "first process."

At an appropriate point in time after performing the process P3, the condition of the primer film 25 formed on the inner wall surface of the casing portion 20 is inspected. For example, a worker inspects the condition of the primer film 25 visually from above in the vertical direction. For example, a worker inspects whether the primer film 25 is evenly applied, and whether a problem such as breakage has occurred on the primer film 25. An imaging device may be used to inspect the condition of the primer film 25 by capturing its image. Since the protruding portion 521 of the insulating sheet 52 was bent in the process P3, this makes it easier for a worker to inspect the condition of the primer film 25 from above in the vertical direction, as compared to the state in which the protruding portion 521 is not bent.

In a process P4 after performing the process P3, the terminal portion 512p of the connection terminal 51p is joined to the top face of the connection conductor 14p, whereas the terminal portion 512n of the connection terminal 51n is joined to the top face of the connection conductor 14n. For example, laser welding is preferably used to join the terminal portions 512 (512p and 512n) respectively to the connection conductors 14 (14p and 14n). The protruding portion 521, which has been bent in the process P3, is in a state of not overlapping the connection conductor 14n in plan view. Therefore, it is easier for a worker to join the terminal portion 512n to the connection conductor 14n in the process P4, as compared to the state in which the protruding portion 521 is not bent.

In a process P5 after performing the process P4, the sealing element 40 is filled into the inner space of the casing portion 20 with the insulating sheet 52 having been bent. Specifically, the sealing element 40 is formed by filling the inner space of the casing portion 20 with a liquid resin material (for example, epoxy resin), and then hardening the resin material by heating or by another method. In the process P5, the sealing element 40 is formed, with the tip portion 521a of the protruding portion 521 kept exposed from the surface F of the sealing element 40. Specifically, the sealing element 40 is filled in conjunction with visually inspecting of the tip portion 521a of the protruding portion 521 by a worker. The process P5 is an example of a "second process."

During the process P5, and after performing the process P5, the condition of the sealing element 40 is inspected as necessary. Specifically, whether the sealing element 40 has been properly formed is inspected. For example, a worker inspects the condition of the sealing element 40 visually from above in the vertical direction. A worker inspects, for example, whether the sealing element 40 sufficiently adheres to the primer film 25, and whether defects such as air bubbles or hollows (spaces not filled with sealing element 40) have appeared in the sealing element 40. An imaging device may be used to inspect the condition of the sealing element 40 by capturing its image. Since the protruding portion 521 of the insulating sheet 52 has already been bent in the process P3, this makes it easier for a worker to inspect the condition of the sealing element 40 from above in the vertical direction, as compared to the state in which the protruding portion 521 is not bent.

As explained above, in the first embodiment, the protruding portion 521 is formed by simply bending a portion of the insulating sheet 52. The sealing element 40 is filled while a worker inspects a state of the tip portion 521a of the protruding portion 521 protruding from the surface F of the sealing element 40. Accordingly, the sealing element 40 can be formed while keeping the protruding portion 521 in the proper state.

B: Second Embodiment

A second embodiment is described below. As for constituent elements of which functions are substantially the same as those of the first embodiment in respective embodiments described below, respective detailed explanations thereof are appropriately omitted and reference signs for explaining the first embodiment are used.

Figure 9:
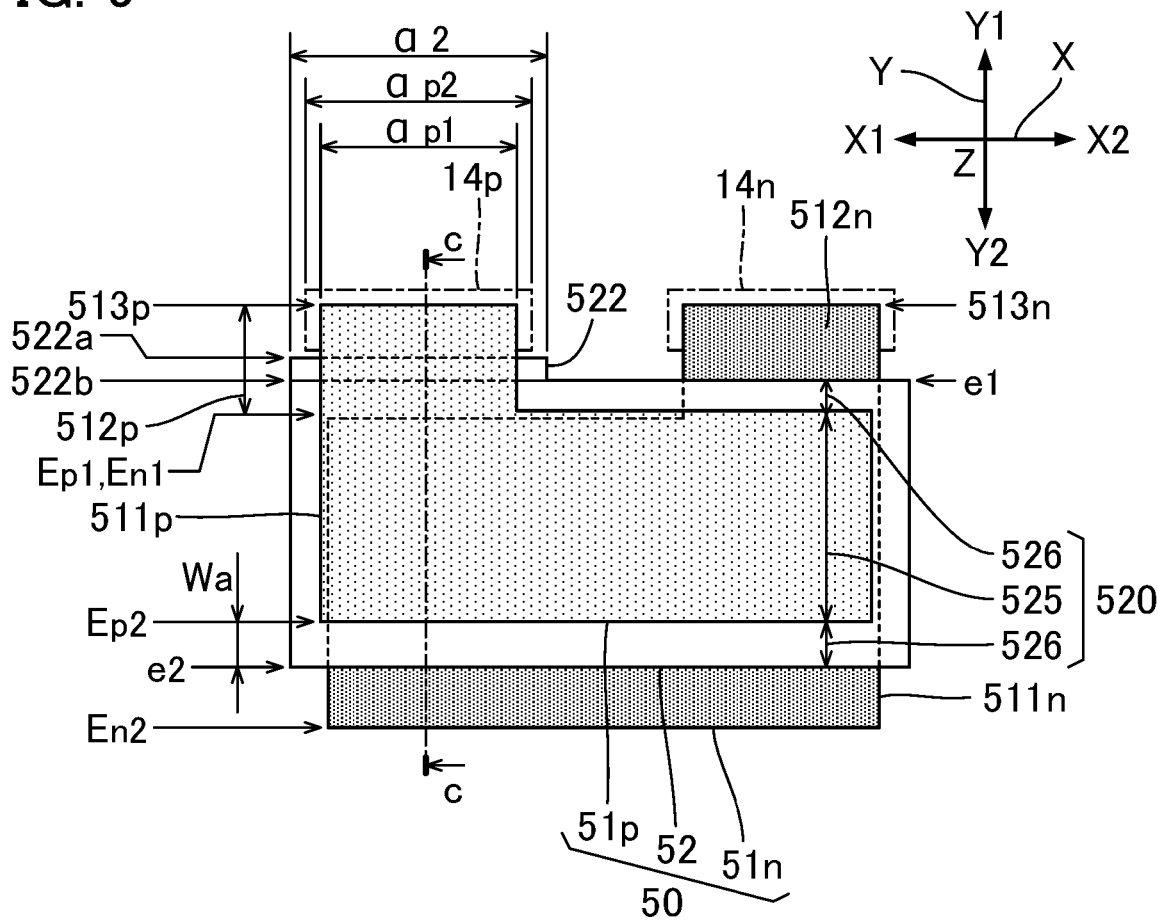
FIG. 9 is a plan view of a connection portion in a second embodiment.

FIG. 9 is a plan view of the connector 50 according to the second embodiment. As exemplified in FIG. 9, the insulating sheet 52 according to the second embodiment includes a protruding portion 522 instead of the protruding portion 521 according to the first embodiment. Configurations other than the protruding portion 522 of the second embodiment are substantially the same as those of the first embodiment.

In the second embodiment, the semiconductor chip 12p is an example of a "first semiconductor chip," and the main electrode C of the semiconductor chip 12p is an example of a "first main electrode." In addition, the semiconductor chip 12n is an example of a "second semiconductor chip," and the main electrode E of the semiconductor chip 12n is an example of a "second main electrode." In the second embodiment, the connection terminal 51p is an example of a "first connection terminal," whereas the connection terminal 51n is an example of a "second connection terminal." In the second embodiment, the conductor portion 511p is an example of a "first conductor portion," and the terminal portion 512p is an example of a "first terminal portion." The peripheral edge Ep1 of the conductor portion 511p is an example of a "first peripheral edge." The conductor portion 511n is an example of a "second conductor portion." The peripheral edge En1 is an example of a "second peripheral edge." The connection conductor 14p according to the second embodiment is an example of a "first connection conductor."

The protruding portion 522 continues from the main body portion 520, with the protruding portion 522 and the main body portion 520 comprising a single piece. As exemplified in FIG. 9, the protruding portion 522 according to the second embodiment is a rectangular portion of the insulating sheet 52 extending from the peripheral edge e1 of the main body portion 520 in the Y1 direction. Specifically, the protruding portion 522 continues from, of the main body portion 520, a part positioned in the X1 direction relative to the reference plane R. That is, the protruding portion 522 has a transverse width in the X-axis direction (the dimension of range α2) narrower than the transverse width of the main body portion 520. For example, the protruding portion 522 has a transverse width narrower than half the transverse width of the main body portion 520. A base end portion 522b in FIG. 9 is, of the protruding portion 522, a part positioned in the vicinity of the boundary (the peripheral edge e1) between the protruding portion 522 and the main body portion 520. A tip portion 522a is the end of the protruding portion 522 on the opposite side to the base end portion 522b. The protruding portion 522 is an example of a "first protruding portion."

Figure 10:
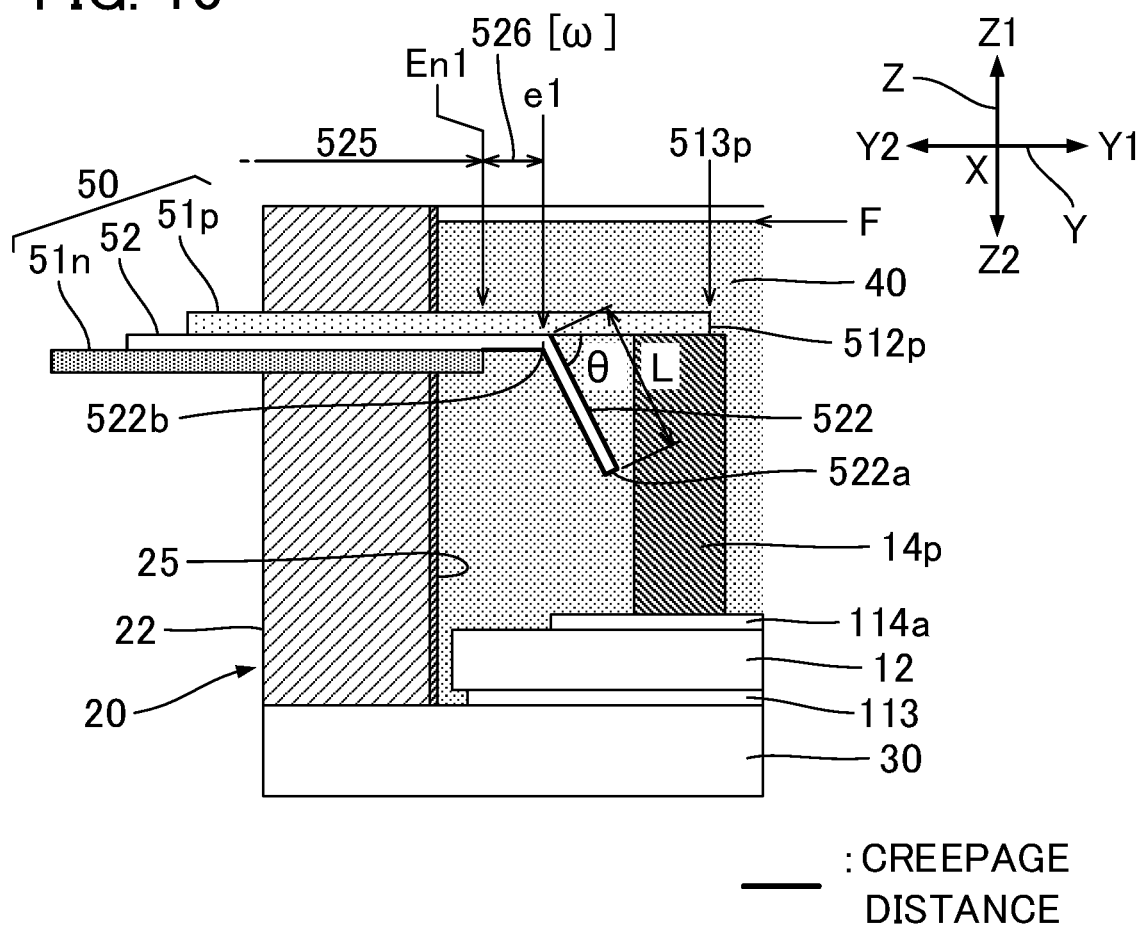
FIG. 10 is an enlarged cross-sectional diagram of the vicinity of a protruding portion in the second embodiment.

FIG. 10 is an enlarged cross-sectional diagram of the semiconductor module 100, illustrating the vicinity of the protruding portion 522. FIG. 10 illustrates the connector 50 in cross-section taken along line c-c in FIG. 9. As exemplified in FIG. 10, the protruding portion 522 forms an angle θ relative to the underside of the terminal portion 512p. That is, the protruding portion 522 is inclined relative to the underside of the terminal portion 512p, such that the tip portion 522a is positioned in the Z2 direction relative to the base end portion 522b in the Z-axis direction. That is, the protruding portion 522 protrudes downward (for example, vertically or obliquely downward) from the underside of the terminal portion 512p. The conditions of the protruding portion 522, that is, the angle θ and the extension length L, are substantially the same as those described in the first embodiment.

As described above, the protruding portion 522 protrudes downward from the terminal portion 512p or the main body portion 520. Therefore, as will be understood from FIG. 10, the connection terminal 51p is positioned between the protruding portion 522 and the surface F of the sealing element 40. That is, in the second embodiment, the protruding portion 522 extends from the underside of the terminal portion 512p toward the opposite side to the surface F of the sealing element 40. Therefore, in contrast to the first embodiment in which the tip portion 521a of the protruding portion 521 is exposed from the surface F of the sealing element 40, the tip portion 522a of the protruding portion 522 according to the second embodiment is positioned in the sealing element 40.

As exemplified in FIGS. 9 and 10, the protruding portion 522 is positioned between the tip portion 513p of the terminal portion 512p and the peripheral edge En1 of the connection terminal 51n in plan view. That is, both the tip portion 522a and the base end portion 522b of the protruding portion 522 are positioned between the tip portion 513p and the peripheral edge En1 in plan view. The protruding portion 522 does not overlap the connection conductor 14p in plan view. That is, both the tip portion 522a and the base end portion 522b of the protruding portion 522 are positioned in the Y2 direction when viewed from the connection conductor 14p.

As exemplified in FIG. 9, the protruding portion 522 according to the second embodiment is connected with the insulating portion 525 through the peripheral edge portion 526. That is, the peripheral edge portion 526 is positioned between the protruding portion 522 and the insulating portion 525 in plan view. The peripheral edge portion 526 corresponds to a portion connecting the protruding portion 522 and the insulating portion 525 together (thus, the peripheral edge portion 526 is a connecting portion). As will be understood from the above explanation, the protruding portion 522 protrudes downward from the position (the base end portion 521b) away from the peripheral edge En1 of the connection terminal 51n by the width dimension ω of the peripheral edge portion 526 in the Y1 direction.

As exemplified in FIG. 9, the range α2 of the protruding portion 522 in the X-axis direction includes a range αp1 of the terminal portion 512p in the X-axis direction. That is, the range α2 is greater than the range αp1, and each end of the range αp1 is positioned within the range α2. Furthermore, the range α2 of the protruding portion 522 in the X-axis direction includes a range αp2 of the connection conductor 14p in the X-axis direction. That is, the range α2 is greater than the range αp2, and each end of the range αp2 is positioned within the range α2.

The semiconductor module 100 according to the second embodiment is manufactured by substantially the same manufacturing method as the first embodiment. However, in contrast to the first embodiment in which the protruding portion 521 is bent upward in the process P3, the protruding portion 522 of the insulating sheet 52 is bent downward in the process P3 in the second embodiment. Specifically, the protruding portion 522 is bent downward along the peripheral edge e1 in such a manner as to form the predetermined angle θ relative to the terminal portion 512p of the connection terminal 51p. In the second embodiment, the process P5 omits inspecting to ensure that the tip portion 521a of the protruding portion 521 is exposed from the surface F of the sealing element 40.

The second embodiment explained above also achieves substantially the same effects as those achieved by the first embodiment. For example, in the second embodiment, the protruding portion 522 that forms the angle θ relative to the terminal portion 512p is positioned between the tip portion 513p of the terminal portion 512p and the peripheral edge En1 of the connection terminal 51n in plan view. Accordingly, it is possible to leave a sufficient creepage distance between the connection terminal 51n and the terminal portion 512p as compared to the comparative example described above. Therefore, in substantially the same manner as in the first embodiment, the second embodiment can effectively maintain electrical insulation between the connection terminals 51p and 51n. Furthermore, since the protruding portion 522, which forms the angle θ relative to the terminal portion 512p, enables a sufficient creepage distance to remain between the terminal portion 512p and the connection terminal 51n, the casing portion 20 is reduced in size in the Y-axis direction as compared to in the comparative example. That is, according to the second embodiment, electrical insulation between the connection terminals 51p and 51n can be maintained, and an increase in the size of the semiconductor module 100 is still reduced or prevented.

C: Third Embodiment

Figure 11:
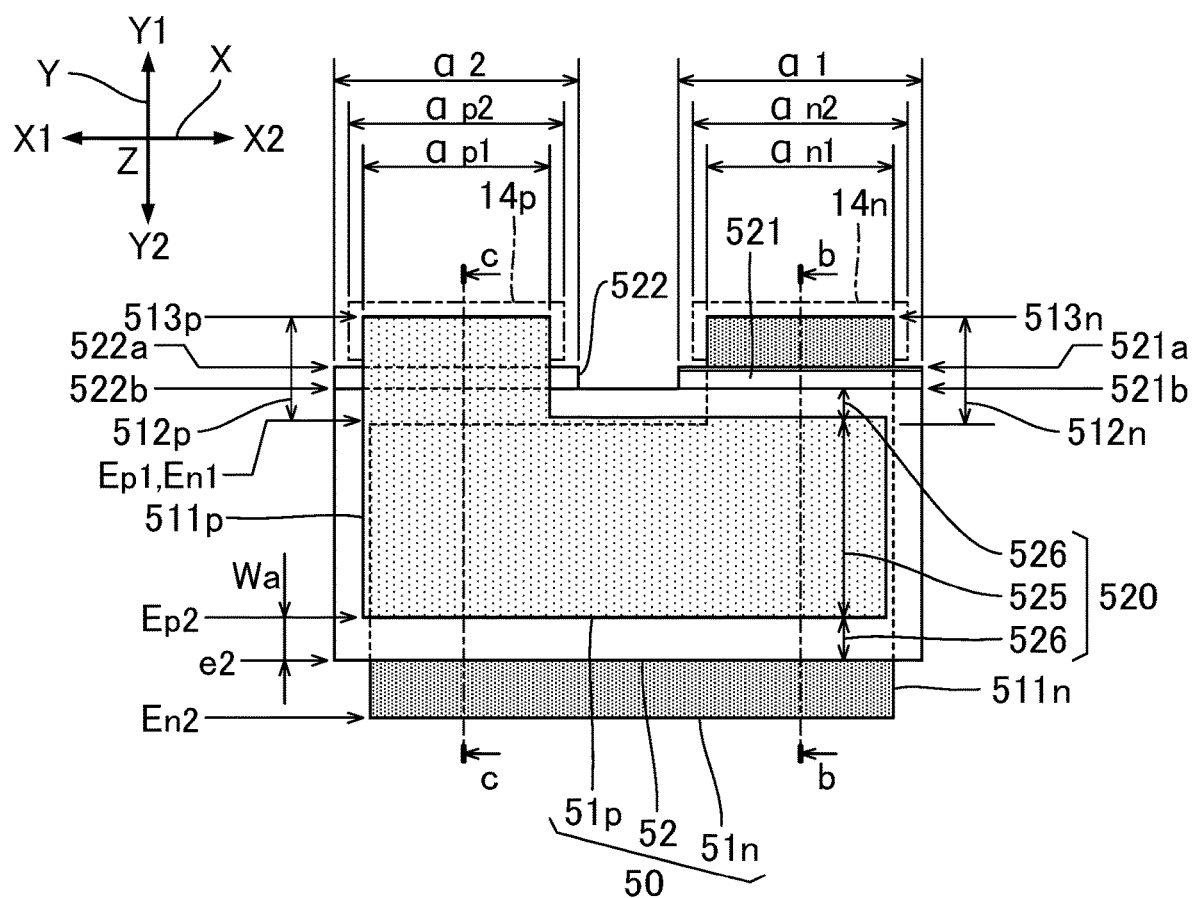
FIG. 11 is a plan view of a connection portion in a third embodiment.

FIG. 11 is a plan view of the connector 50 according to a third embodiment. The third embodiment is an embodiment obtained by combining the first embodiment and the second embodiment. That is, the insulating sheet 52 according to the third embodiment includes both the protruding portion 521 according to the first embodiment and the protruding portion 522 according to the second embodiment. The constituent elements other than the protruding portions 521 and 522 are substantially the same as those according to the first embodiment. The cross-section taken along line b-b in FIG. 11 corresponds to FIG. 4. The cross-section taken along line c-c in FIG. 11 corresponds to FIG. 10. In the third embodiment, the protruding portion 521 is an example of a "first protruding portion," and the protruding portion 522 is an example of a "second protruding portion." The configuration of the protruding portion 521 is substantially the same as that of the first embodiment. The configuration of the protruding portion 522 is substantially the same as that of the second embodiment. Accordingly, the third embodiment achieves substantially the same effects as those achieved by the first and second embodiments.

As explained in the first embodiment, the protruding portion 521 is positioned in the X2 direction relative to the reference plane R in plan view. As explained in the second embodiment, the protruding portion 522 is positioned in the X1 direction relative to the reference plane R in plan view. That is, the protruding portions 521 and 522 according to the third embodiment are positioned on opposite sides to each other with the reference plane R sandwiched therebetween. The reference plane R includes the center line of the main body portion 520 of the insulating sheet 52 in its width direction. Therefore, the protruding portions 521 and 522 may be expressed as being positioned on opposite sides to each other with the center line of the main body portion 520 sandwiched therebetween. The transverse width of the protruding portion 521 may be equivalent to the transverse width of the protruding portion 522. The extension length L of the protruding portion 521 may also be equivalent to the extension length L of the protruding portion 522.

As explained in the first embodiment, the protruding portion 521 protrudes upward from the topside of the terminal portion 512n. On the other hand, as explained in the second embodiment, the protruding portion 522 protrudes downward from the underside of the terminal portion 512p. That is, the protruding portions 521 and 522 protrude from the main body portion 520 toward opposite sides to each other. With the configuration described above, when the insulating sheet 52 separates from the sealing element 40, the protruding portion 521 enables sufficient creepage distance to remain between the terminal portion 512n and the connection terminal 51p, and the protruding portion 522 enables sufficient creepage distance to remain between the terminal portion 512p and the connection terminal 51n. That is, the third embodiment can achieve a significant effect of maintaining electrical insulation between the connection terminals 51p and 51n.

In the third embodiment, the semiconductor chip 12n is an example of a "first semiconductor chip," and the main electrode E of the semiconductor chip 12n is an example of a "first main electrode" in substantially the same manner as in the first embodiment. In addition, the semiconductor chip 12p is an example of a "second semiconductor chip," and the main electrode C of the semiconductor chip 12p is an example of a "second main electrode." In the third embodiment, the conductor portion 511n is an example of a "first conductor portion," and the terminal portion 512n is an example of a "first terminal portion." Furthermore, the conductor portion 511p is an example of a "second conductor portion," and the terminal portion 512p is an example of a "second terminal portion."

D: Fourth Embodiment

Figure 12:
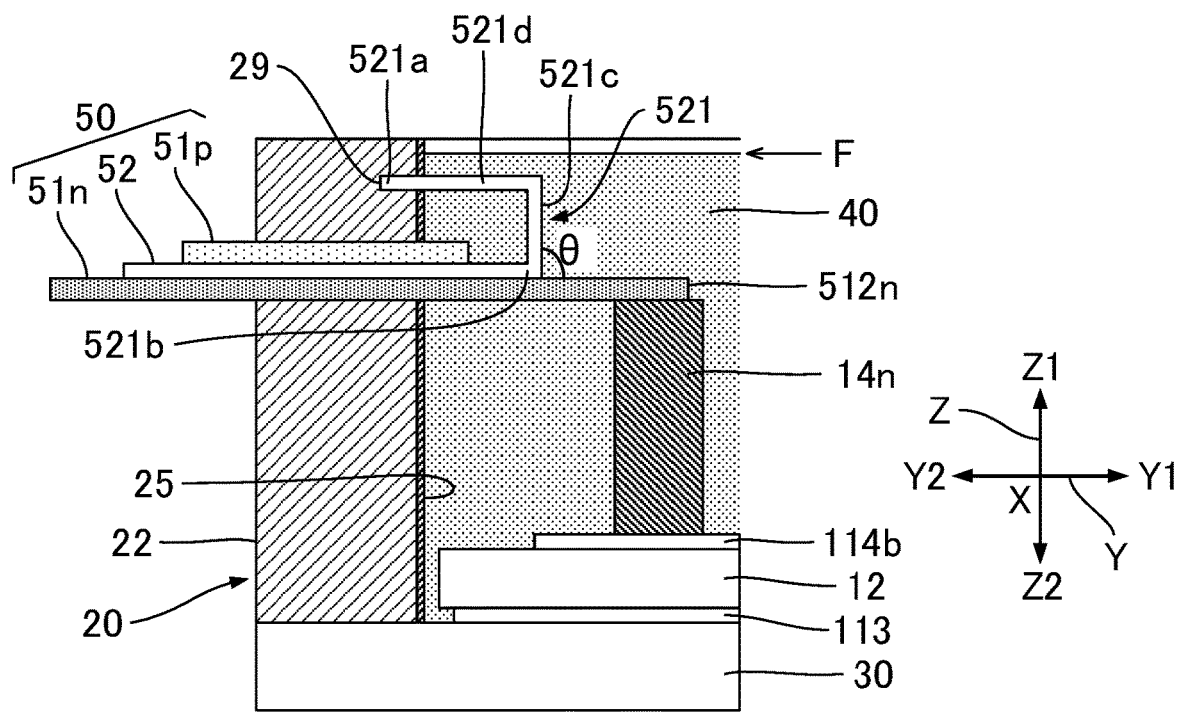
FIG. 12 is an enlarged cross-sectional diagram of the vicinity of a protruding portion in a fourth embodiment.

FIG. 12 is an enlarged cross-sectional diagram of the semiconductor module 100, illustrating the vicinity of the protruding portion 521 according to a fourth embodiment. As exemplified in FIG. 12, the protruding portion 521 according to the fourth embodiment includes a first part 521c and a second part 521d. The first part 521c and the second part 521d are continuous with each other. The first part 521c is a part of the protruding portion 521 positioned closer to the base end portion 521b. The second part 521d is a part of the protruding portion 521 positioned closer to the tip portion 521a. That is, the tip portion 521a is a peripheral edge of the second part 521d positioned on the opposite side to the first part 521c.

In a substantially similar manner as the protruding portion 521 according to the first embodiment, the first part 521c protrudes upward at an angle θ formed relative to the terminal portion 512n. FIG. 12 illustrates an example in which the angle θ is approximately 90°. The second part 521d extends in the Y2 direction from the peripheral edge of the first part 521c on the opposite side to the base end portion 521b. That is, the second part 521d extends in a direction parallel to the main body portion 520 of the insulating sheet 52. As will be understood from the above explanation, the protruding portion 521 according to the fourth embodiment has a shape such that the protruding portion 521 is bent from the base end portion 521b and is then bent back toward the side wall 22 (in the Y2 direction) of the casing portion 20.

The tip portion 521a of the protruding portion 521 penetrates into (i.e., partially penetrates) the inner wall surface of the side wall 22 of the casing portion 20. Specifically, the tip portion 521a is accommodated in a groove portion 29 formed on the inner wall surface of the side wall 22. The groove portion 29 is a hole with a bottom extending linearly in the X-axis direction across the entire width of the protruding portion 521. The tip portion 521a is inserted into the groove portion 29, so that the second part 521d of the protruding portion 521 is fixed to the casing portion 20. For example, in the process P3 in FIG. 6, the protruding portion 521 of the insulating sheet 52 is bent toward the side wall 22, and the tip portion 521a is inserted (i.e., fitted) into the groove portion 29. The tip portion 521a may be joined to the groove portion 29 by using, for example, an adhesive.

The fourth embodiment also achieves substantially the same effects as those achieved by the first embodiment. In the fourth embodiment, the tip portion 521a of the protruding portion 521 penetrates into the inner wall surface of the side wall 22 of the casing portion 20, so that the shape of the protruding portion 521 can be maintained stably, for example, in the manufacturing process of the semiconductor module 100 (for example, in the process P5 of forming the sealing element 40).

Figure 13:
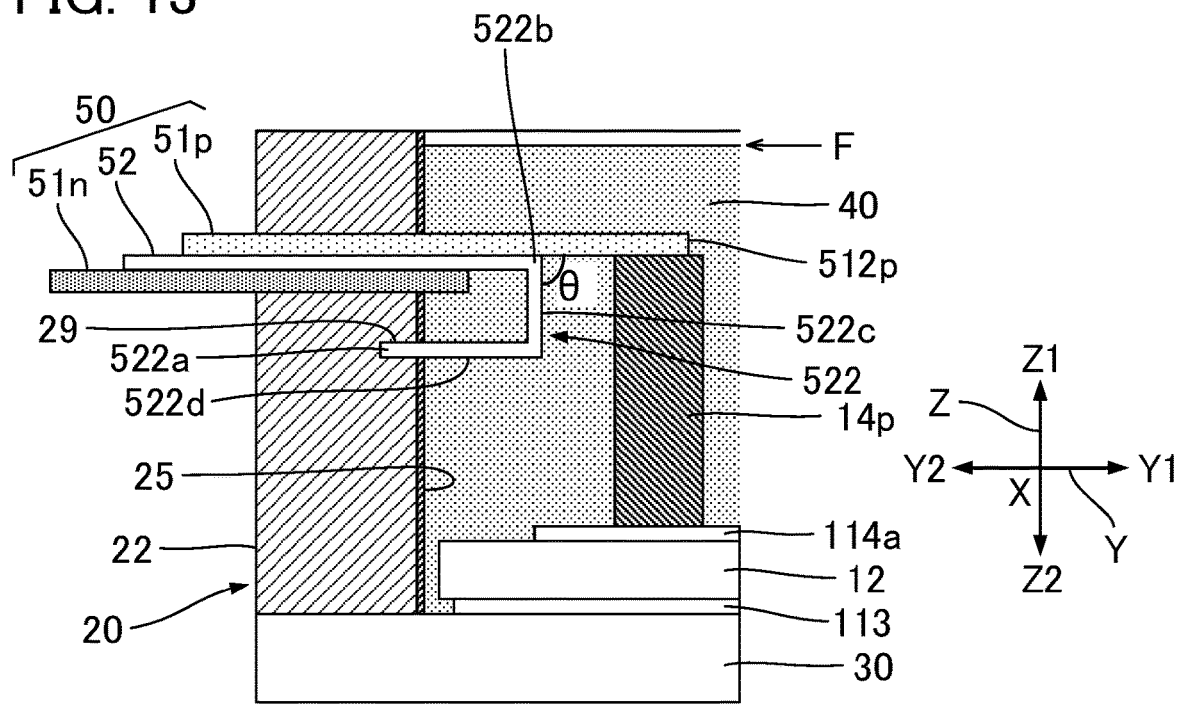
FIG. 13 is an enlarged cross-sectional diagram of the vicinity of a protruding portion in a modification of the fourth embodiment.

FIG. 12 exemplifies the protruding portion 521 extending upward from the terminal portion 512n. As exemplified in FIG. 13, substantially the same configuration is also employed for the protruding portion 522 extending downward from the terminal portion 512p. The protruding portion 522 in FIG. 13 is formed into such a shape that a first part 522c positioned closer to a base end portion 522b is continuous with a second part 522d positioned closer to a tip portion 522a. The first part 522c protrudes downward at an angle θ (θ≈90°) formed relative to the terminal portion 512p. The second part 522d extends in the Y2 direction from the peripheral edge of the first part 522c on the opposite side to the base end portion 522b. That is, the protruding portion 522 in FIG. 13 has a shape such that the protruding portion 522 is bent from the base end portion 522b and is then bent back toward the side wall 22 (in the Y2 direction) of the casing portion 20. The tip portion 522a of the protruding portion 522 penetrates into the inner wall surface of the side wall 22 of the casing portion 20. Specifically, the tip portion 522a is accommodated in a groove portion 29 formed on the inner wall surface of the side wall 22 in substantially the same manner as the tip portion 521a according to the fourth embodiment.

E: Modifications

Specific modifications added to the respective embodiments exemplified above are exemplified below. Two or more embodiments freely selected from the following exemplifications may be appropriately combined so long as there is no conflict.

Figure 14:
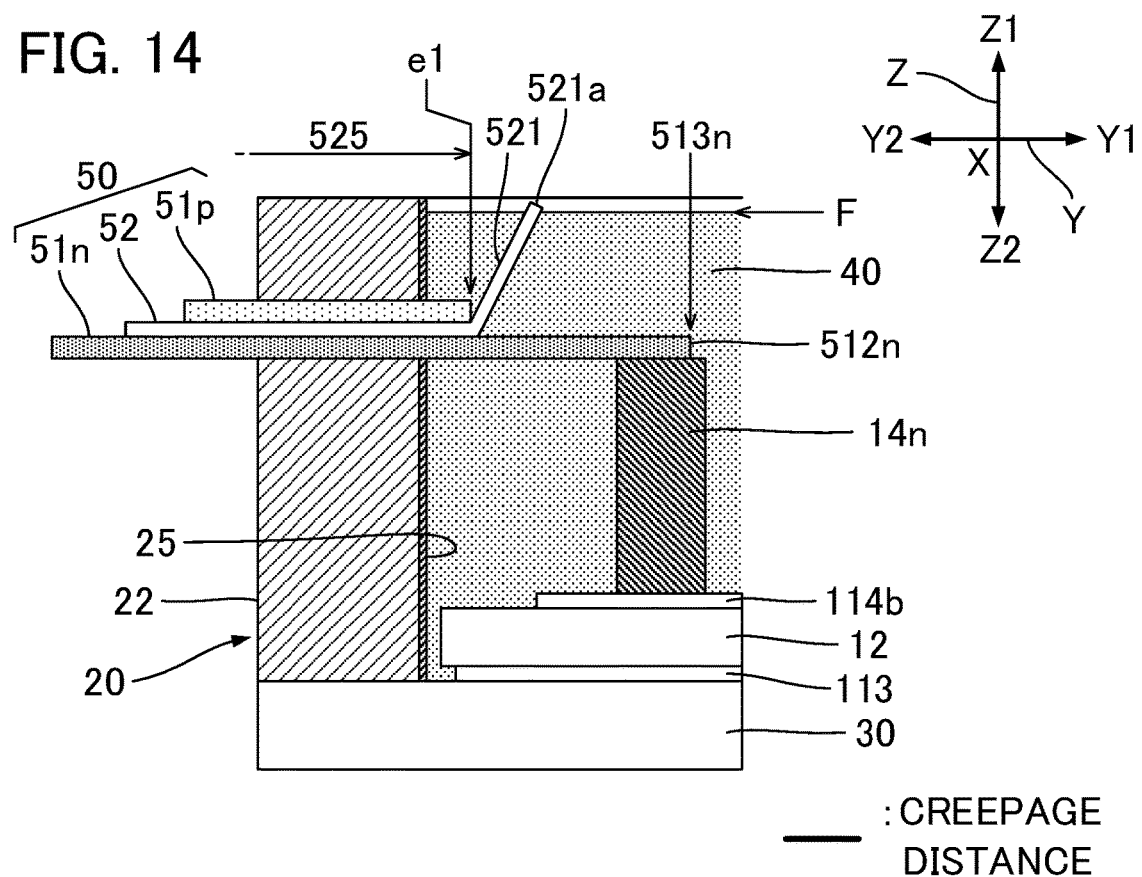
FIG. 14 is an enlarged cross-sectional diagram of the vicinity of a protruding portion in a modification.

(1) In each of the embodiments described above, the configuration is exemplified in which the insulating portion 525 is connected with the protruding portion 521 through the peripheral edge portion 526. As exemplified in FIG. 14, a configuration is also assumed in which the protruding portion 521 is continuous with the insulating portion 525. That is, the peripheral edge portion 526 in each of the embodiments described above may be omitted. However, each of the embodiments described above, in which the peripheral edge portion 526 is interposed between the insulating portion 525 and the protruding portion 521, has the advantage that it is easier to enable sufficient creepage distance to remain between the terminal portion 512n and the connection terminal 51p, as compared to the configuration in FIG. 14. In FIG. 14, the focus is on the protruding portion 521. However, substantially the same configuration is also employed for the protruding portion 522. That is, the protruding portion 522 may be continuous with the insulating portion 525.

(2) In each of the embodiments described above, a configuration is exemplified in which the protruding portion 521 continues from the main body portion 520 of the insulating sheet 52, with the protruding portion 521 and the main body portion 520 comprising a single piece. A configuration is also assumed in which the main body portion 520 of the insulating sheet 52 is connected with the protruding portion 521, which is a separate piece from this main body portion 520. For example, the protruding portion 521 that is a separate piece from the main body portion 520 is connected with the main body portion 520 by bonding or welding. In the above explanation, the focus is on the protruding portion 521. However, substantially the same configuration is also employed for the protruding portion 522. It is to be noted that the configuration in which the protruding portion 521 is continuous with the main body portion 520, with the protruding portion 521 and the main body portion 520 comprising a single piece, has an advantage that the protruding portion 521 can be easily formed merely by deforming (for example, bending) the insulating sheet 52, as compared to the configuration in which the main body portion 520 and the protruding portion 521, which are separate pieces from each other, are connected together.

(3) In each of the embodiments described above, a configuration is exemplified in which the insulating sheet 52 is made of insulating paper. However, the material of the insulating sheet 52 is not limited to the example described above. For example, a resin film made of a resin material such as polyimide may be used as the insulating sheet 52. However, in each of the embodiments described above in which the insulating sheet 52 is made of insulating paper, the insulating sheet 52 can be easily deformed (for example, bent) as compared to a configuration in which the insulating sheet 52 is made of a resin film. Therefore, each of the embodiments described above has an advantage that the insulating sheet 52 is easy to handle. Additionally, each of the embodiments described above has an advantage that breakage, such as cracking in the insulating sheet 52, is less likely to occur, as compared to a configuration in which, for example, the insulating sheet 52 is made of any type of ceramic.

(4) In each of the embodiments described above, the configuration is exemplified in which the sealing element 40 is filled into the inner space of the casing portion 20. However, the sealing element 40 may be omitted. On the other hand, the creepage distance between the terminal portion 512n and the connection terminal 51p particularly matters when the insulating sheet 52 separates from the sealing element 40. Therefore, the configuration in which the protruding portion 521 or the protruding portion 522 is installed is effective, especially in the embodiment in which the casing portion 20 is filled with the sealing element 40.

(5) In each of the embodiments described above, a configuration is exemplified in which the protruding portion 521 does not overlap the connection conductor 14n in plan view. A configuration is also assumed in which the protruding portion 521 partially or entirely overlaps the connection conductor 14n in plan view. The protruding portion 522 may also partially or entirely overlap the connection conductor 14p in plan view.

(6) In each of the embodiments described above, a configuration is exemplified in which the semiconductor unit 10 is accommodated in the space surrounded by the casing portion 20 and the base portion 30 at the bottom. However, the base portion 30 is not an essential element for the semiconductor module 100. For example, as exemplified in FIG. 15, a configuration is also assumed in which the base portion 30 is not used.

Figure 15:
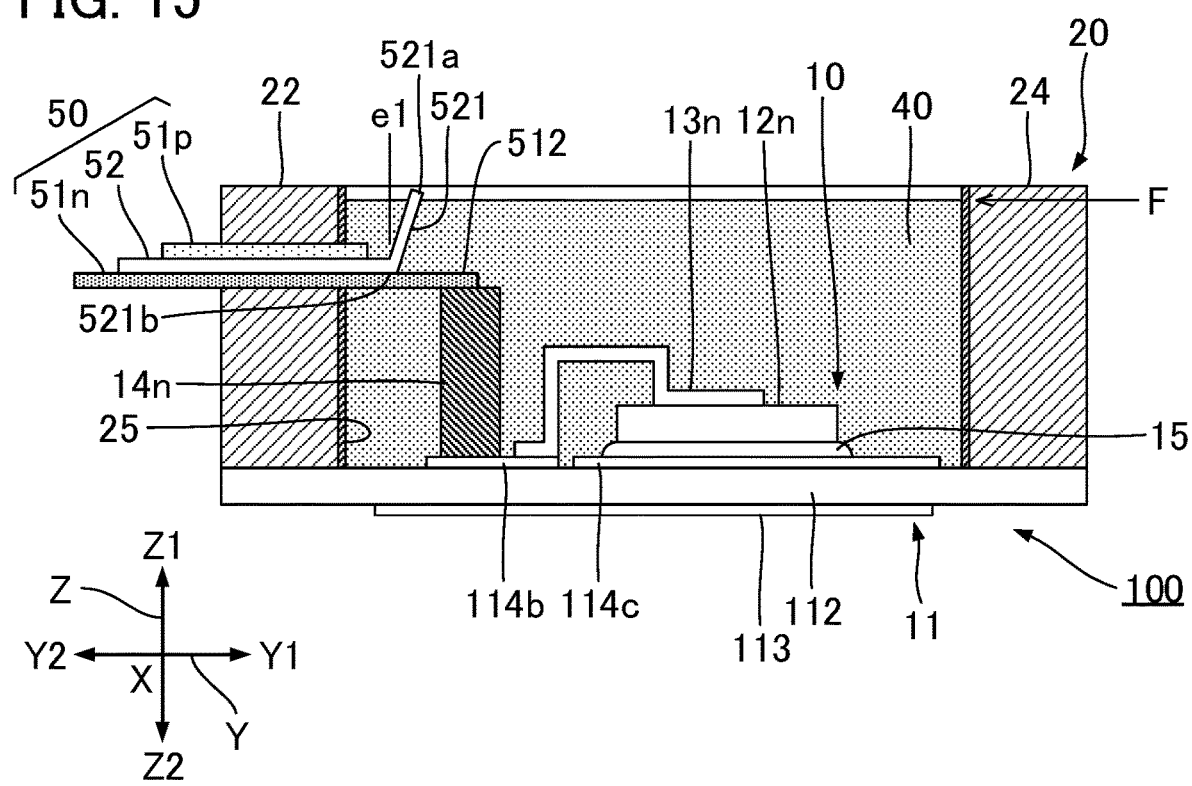
FIG. 15 is a cross-sectional diagram of a semiconductor module according to the modification.

In the configuration in FIG. 15, the insulating substrate 112 of the layered substrate 11 and the casing portion 20 are joined to each other, so that the semiconductor unit 10 is supported by the casing portion 20. Specifically, the edge portion of the topside of the insulating substrate 112 is joined to the underside of the casing portion 20 by, for example, using an adhesive. In the configuration in FIG. 15, the insulating substrate 112 and the metal layer 113 are positioned in the Z2 direction relative to the underside of the casing portion 20. That is, the semiconductor unit 10 is partially positioned outside the space surrounded by the casing portion 20. On the other hand, in each of the embodiments described above, the semiconductor unit 10 is surrounded in its entirety by the casing portion 20. As will be understood from the above example, the casing portion 20 is comprehensively expressed as an element that surrounds the semiconductor chips 12, regardless of whether the casing portion 20 surrounds the semiconductor unit 10 entirely or partially. It is to be noted that the side of the insulating substrate 112 may be joined to the inner wall surface of the casing portion 20 by, for example, using an adhesive.

In each of the embodiments described above, a configuration is exemplified in which the sealing element 40 is filled even into the space to the sides of the layered substrate 11 and the bottom space thereof. As will be understood from the example in FIG. 15, an embodiment is also assumed in which the sealing element 40 does not reach the space to the sides of the layered substrate 11 or the bottom space thereof.

(7) In each of the embodiments described above, a configuration is exemplified in which the semiconductor chips 12 include an RC-IGBT. However, the configuration of the semiconductor chips 12 is not limited to the above example. For example, an embodiment is also assumed in which the semiconductor chips 12 include an IGBT or a MOSFET. In the embodiment in which the semiconductor chips 12 include the MOSFET, the main electrode C is one of a source electrode and a drain electrode, and the main electrode E is the other electrode. The number of semiconductor chips 12 included in the semiconductor module 100 is not limited to two. For example, an embodiment is also assumed in which the semiconductor module 100 includes one semiconductor chip 12, or three or more semiconductor chips 12.

DESCRIPTION OF REFERENCE SIGNS

100 . . . semiconductor module, 10 . . . semiconductor unit, 11 . . . layered substrate, 112 . . . insulating substrate, 113 . . . metal layer, 114 (114a, 114b, 114c) . . . conductor pattern, 12 (12p, 12n) . . . semiconductor chip, 13 (13p, 13n) . . . wiring portion, 14 (14p, 14n, 14o) . . . connection conductor, 20 . . . casing portion, 21, 22, 23, 24 . . . side wall, 25 . . . primer film, 26 . . . connection terminal, 27 . . . control terminal, 28 . . . wire, 29 . . . groove portion, 30 . . . base portion, 40 . . . sealing element, 50 . . . connector, 51 (51p, 51n) . . . connection terminal, 52 . . . insulating sheet, 511 (511p, 511n) . . . conductor portion, 512 (512p, 512n) . . . terminal portion, 513 (513p, 513n) . . . tip portion, 520 . . . main body portion, 521, 522 . . . protruding portion, 521a, 522b . . . tip portion, 521b, 522b . . . base end portion, 521c, 522c . . . first part, 521d, 522d . . . second part, 525 . . . insulating portion, 526 . . . peripheral edge portion.

What is claimed is:

1. A semiconductor module comprising:
a first semiconductor chip including a first main electrode;
a second semiconductor chip including a second main electrode;
a first connection terminal electrically connected to the first main electrode, and including:
a first conductor portion including a first peripheral edge, and
a first terminal portion extending from the first peripheral edge in a plan view of the semiconductor module,
a second connection terminal electrically connected to the second main electrode, and including a second conductor portion including a second peripheral edge; and
an insulating sheet with insulation properties, and including:
an insulating portion layered between the first conductor portion and the second conductor portion, and
a first protruding portion positioned between a tip portion of the first terminal portion and the second peripheral edge in the plan view, the first protruding portion at an angle relative to a surface of the first terminal portion,
wherein
at least a part of the first conductor portion and at least a part of the second conductor portion overlap, one part over an other part, in the plan view.

2. The semiconductor module according to claim 1, comprising:
a casing portion surrounding the first semiconductor chip and the second semiconductor chip; and
a sealing element filled into an inner space of the casing portion, wherein the first terminal portion and the second peripheral edge are sealed by the sealing element in the inner space of the casing portion.

3. The semiconductor module according to claim 2, wherein the first protruding portion is positioned between the first connection terminal and a surface of the sealing element.

4. The semiconductor module according to claim 3, wherein a part of the first protruding portion protrudes from the surface of the sealing element.

5. The semiconductor module according to claim 3, wherein:
the second connection terminal further includes a second terminal portion extending from the second peripheral edge in the plan view,
the first terminal portion and the second terminal portion do not overlap in the plan view, and
the insulating sheet further includes a second protruding portion positioned between a tip portion of the second terminal portion and the first peripheral edge in the plan view, the second protruding portion forming an angle relative to a surface of the second terminal portion.

6. The semiconductor module according to claim 2, wherein the first terminal portion is positioned between the first protruding portion and the surface of the sealing element.

7. The semiconductor module according to claim 2, wherein:
the first connection terminal, the second connection terminal, and the insulating sheet penetrate therethrough a side wall of the casing portion, and
a tip portion of the first protruding portion partially penetrates an inner wall surface of the side wall.

8. The semiconductor module according to claim 1, wherein a range of the first protruding portion in a first direction along the first peripheral edge includes a range of the first terminal portion in the first direction.

9. The semiconductor module according to claim 1, further comprising a first connection conductor electrically connected to the first main electrode,
wherein the first terminal portion is joined to the first connection conductor.

10. The semiconductor module according to claim 9, wherein a range of the first protruding portion in a first direction along the first peripheral edge includes a range of the first connection conductor in the first direction.

11. The semiconductor module according to claim 9, wherein:
the first terminal portion and the first connection conductor overlap one over the other in the plan view, and
the first protruding portion does not overlap the first connection conductor in the plan view.

12. The semiconductor module according to claim 1, wherein:
the insulating sheet includes a connecting portion configured to connect the first protruding portion and the insulating portion together, and
the connecting portion is a portion continuous with the insulating portion in a flush manner.

13. The semiconductor module according to claim 1, wherein the first protruding portion is continuous with another portion of the insulating sheet, and
wherein the first protruding portion and the another portion comprise a single piece.

14. The semiconductor module according to claim 1, wherein the insulating sheet is insulating paper.

* * * * *